(12) United States Patent
Toda

(10) Patent No.: US 9,515,208 B2
(45) Date of Patent: Dec. 6, 2016

(54) SOLID-STATE IMAGE PICKUP DEVICE AND ELECTRONIC APPARATUS

(71) Applicant: SONY CORPORATION, Tokyo (JP)

(72) Inventor: Atsushi Toda, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/653,780

(22) PCT Filed: Dec. 17, 2013

(86) PCT No.: PCT/JP2013/007408
§ 371 (c)(1),
(2) Date: Jun. 18, 2015

(87) PCT Pub. No.: WO2014/103239
PCT Pub. Date: Jul. 3, 2014

(65) Prior Publication Data
US 2015/0325721 A1    Nov. 12, 2015

(30) Foreign Application Priority Data
Dec. 25, 2012  (JP) .................. 2012-281483

(51) Int. Cl.
*H01L 31/102* (2006.01)
*H01L 31/032* (2006.01)
(Continued)

(52) U.S. Cl.
CPC ....... *H01L 31/0322* (2013.01); *H01L 27/1463* (2013.01); *H01L 27/1464* (2013.01);
(Continued)

(58) Field of Classification Search
CPC ................ H01L 27/14643; H01L 27/14614; H01L 27/1463; H01L 27/1464; H01L 27/14689; H01L 31/1884; H01L 31/0322; H01L 31/022475; H04N 5/225
See application file for complete search history.

(56) References Cited

U.S. PATENT DOCUMENTS

2011/0024859 A1* 2/2011 Miyazaki .......... H01L 27/14645
257/432
2011/0205412 A1* 8/2011 Miyazaki .......... H01L 27/14621
348/294
(Continued)

FOREIGN PATENT DOCUMENTS

EP        2273565 A1    1/2011
EP        2398054 A2    12/2011
(Continued)

OTHER PUBLICATIONS

English Translation WO2013/088983A1, pub date Jun. 20, 2013; pp. 1-29.*

(Continued)

*Primary Examiner* — Shaun Campbell
(74) *Attorney, Agent, or Firm* — Chip Law Group

(57) ABSTRACT

Solid-state imaging devices (1) including: a substrate (12); a photoelectric conversion section (50) comprising a chalcopyrite material formed over the substrate in a light incident side; a transparent electrode (57) in the light incident side of the photoelectric conversion section; and an electron barrier layer (58) formed between the photoelectric conversion section and the transparent electrode; and methods of manufacturing the solid-state imaging devices and electronic apparatuses including the solid-state imaging devices.

14 Claims, 28 Drawing Sheets

(51) Int. Cl.
  *H04N 5/225*      (2006.01)
  *H01L 31/0224*    (2006.01)
  *H01L 31/18*      (2006.01)
  *H01L 27/146*     (2006.01)

(52) U.S. Cl.
  CPC .. *H01L 27/14614* (2013.01); *H01L 27/14643* (2013.01); *H01L 27/14689* (2013.01); *H01L 31/022475* (2013.01); *H01L 31/1884* (2013.01); *H04N 5/225* (2013.01)

(56) References Cited

U.S. PATENT DOCUMENTS

| | | |
|---|---|---|
| 2012/0138129 A1 | 6/2012 | Kim |
| 2013/0213478 A1* | 8/2013 | Munteanu ........... H01L 21/2254 136/264 |

FOREIGN PATENT DOCUMENTS

| | | |
|---|---|---|
| JP | 2007-123720 A | 5/2007 |
| JP | 2007-335625 A | 12/2007 |
| JP | 2009-259872 A | 11/2009 |
| JP | 2011-146635 A | 7/2011 |
| JP | 2011-151271 A | 8/2011 |
| JP | 2011-199057 A | 10/2011 |
| WO | 2013-088983 A1 | 6/2013 |

OTHER PUBLICATIONS

K. Miyazaki et al. "High sensitivity and wide bandwith image sensor using CuIn1-xGaxSe2 thin films." Thin Solid Films 517 (2009) 2392-2394.

* cited by examiner

SOLID-STATE IMAGE PICKUP DEVICE AND ELECTRONIC APPARATUS

TECHNICAL FIELD

The present technology relates to a solid-state image pickup device. The present technology also relates to an electronic apparatus that includes the solid-state image pickup device.

BACKGROUND ART

Examples of a solid-state image pickup device include a CMOS image sensor that reads, via a MOS transistor, photoelectric charge accumulated in a pn junction capacitance of a photodiode, where the photodiode is included in a photoelectric conversion device. In particular, a CMOS image sensor has been proposed that uses a chalcopyrite material, such as $CuInGaS_2$ and $CuInGaSe_2$, as a photoelectric conversion section. For example, it has been proposed to use, in the photoelectric conversion section, a compound semiconductor film such as, a $CuInGaSe_2$ film, having high light absorption coefficient, which may thereby achieve higher sensitivity (for example, see PTL 1). Also, interlayer films of Cds and i-type ZnO may be inserted between n-type ZnO and p-$CuInGaSe_2$ to thereby prevent a leakage current that occurs in a reverse bias state (for example, see PTL 2 and PTL 3). The interlayer films of Cds and i-type ZnO serve as a barrier that may reduce or prevent holes from being injected from an n-side electrode side to a $CuInGaSe_2$-film side when a reverse bias is applied. Further, a CMOS image sensor has been proposed that has a high S/N ratio and that uses, for the photoelectric conversion section, a compound semiconductor film such as a $CuInGaS_2$ film, that is lattice-matched to a Si substrate (for example, see PTL 4). Further, for the photoelectric conversion section, a compound semiconductor film may be used, such as a $CuInGaS_2$ film having high light absorption coefficient to shield light, and thereby a global shutter may be achieved (for example, see PTL 5).

CITATION LIST

Patent Literature

[PTL 1]
JP 2007-123720A
[PTL 2]
JP 2011-151271A
[PTL 3]
JP 2009-259872A
[PTL 4]
JP 2011-146635A
[PTL 5]
JP 2011-199057A

SUMMARY

Technical Problem

When a voltage in reverse bias is applied to the photoelectric conversion section to read signals in a CMOS image sensor that uses a chalcopyrite material for a photoelectric conversion section, electrons may be injected from an electron-side electrode to a photoelectric conversion film side, thereby causing a leakage current in some cases. A component of this leakage current becomes a noise component as a dark current for an image pickup unit. Accordingly, a S/N ratio is decreased and image quality is degraded.

Thus, various embodiments of the present disclosure may advantageously provide a solid-state image pickup device capable of suppressing or reducing degradation in image quality caused by a leakage current leaked into the photoelectric conversion section, and an electronic apparatus that includes the solid-state image pickup device.

Solution to Problem

Various embodiments of the present disclosure are directed towards solid-state imaging devices comprising: a substrate; a photoelectric conversion section comprising a chalcopyrite material formed over the substrate in a light incident side; a transparent electrode in the light incident side of the photoelectric conversion section; and an electron barrier layer formed between the photoelectric conversion section and the transparent electrode.

Further illustrative embodiments of the present disclosure are directed towards manufacturing methods of a solid-state imaging device comprising: forming a photoelectric conversion section comprising a chalcopyrite material; forming a transparent electrode in the light incident side of the photoelectric conversion section; and forming an electron barrier layer between the photoelectric conversion section and the transparent electrode.

Still further illustrative embodiments of the present disclosure are directed towards electronic apparatuses comprising: a solid-state imaging device comprising a substrate; a photoelectric conversion section comprising a chalcopyrite material formed over the substrate in a light incident side; a transparent electrode in the light incident side of the photoelectric conversion section; and an electron barrier layer formed between the photoelectric conversion section and the transparent electrode.

Advantageous Effects of Invention

According to the above-described embodiments of the present technology, the solid-state image pickup device capable of improving image quality and an electronic apparatus that includes the solid-state image pickup device are provided.

Both the foregoing general description and the following detailed description are illustrative, and are intended to provide further explanation of the technology as claimed.

BRIEF DESCRIPTION OF DRAWINGS

The accompanying drawings are included to provide a further illustrative understanding of the disclosure, and are incorporated in and constitute a part of this specification. The drawings illustrate various embodiments and, together with the specification, serve to explain illustrative principles of the technology.

DESCRIPTION OF ILLUSTRATIVE EMBODIMENTS

Figure 1:
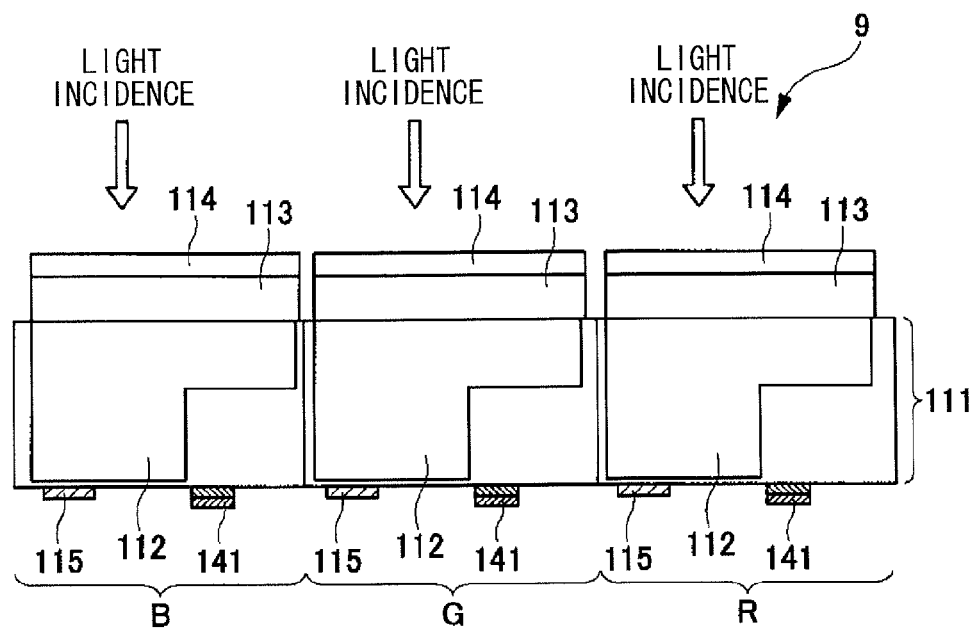
FIG. 1 is a diagram illustrating a structure of a solid-state image pickup device that uses a chalcopyrite material for a photoelectric conversion section in the prior art.

Examples of some embodiments of the present technology will be described herein. The present technology is not limited to the examples described herein. The description will be given in the following order.
1 Outline of Some Embodiments of Present Technology
2 First Embodiment (Solid-state Image Pickup Device)
3 First Embodiment (Method of Manufacturing Solid-state Image Pickup Device)
4 First Modification of First Embodiment
5 Second Modification of First Embodiment
6 Second Embodiment (Electronic Apparatus)
1. Outline of Some Embodiments of Present Technology Illustrative outlines of some embodiments of the present disclosure will be described herein. FIG. 1 shows an illustrative structure of a solid-state image pickup device, of prior art, that uses chalcopyrite material for a photoelectric conversion section. In the solid-state image pickup device having the structure shown in FIG. 1, a reading electrode 115, electrodes such as a gate MOS 141, a transistor, wirings, etc. are formed on a front face side of a silicon substrate 111 (on a surface, in a lower part in the drawing, of the silicon substrate 111). The silicon substrate 111 is formed of a p-type silicon substrate. In the silicon substrate 111, an n-type electrode layer (lower electrode) 112 is so formed as to extend to the vicinity of the back face of the silicon substrate 111. The n-type electrode layer 112 may be configured, for example, of an n-type silicon layer that is formed in the above-described silicon substrate 111. Further, on the n-type electrode layer 112, a photoelectric conversion section 113 is formed. The photoelectric conversion section 113 is configured of lattice-matched CuAlGaInSSe-based mixed crystal. On the photoelectric conversion section 113, a p-type transparent electrode 114 that transmits light is formed. The transparent electrode 114 may be formed, for example, of a transparent electrode material such as indium-tin oxide (ITO), zinc oxide, and indium-zinc oxide.

Figure 2:
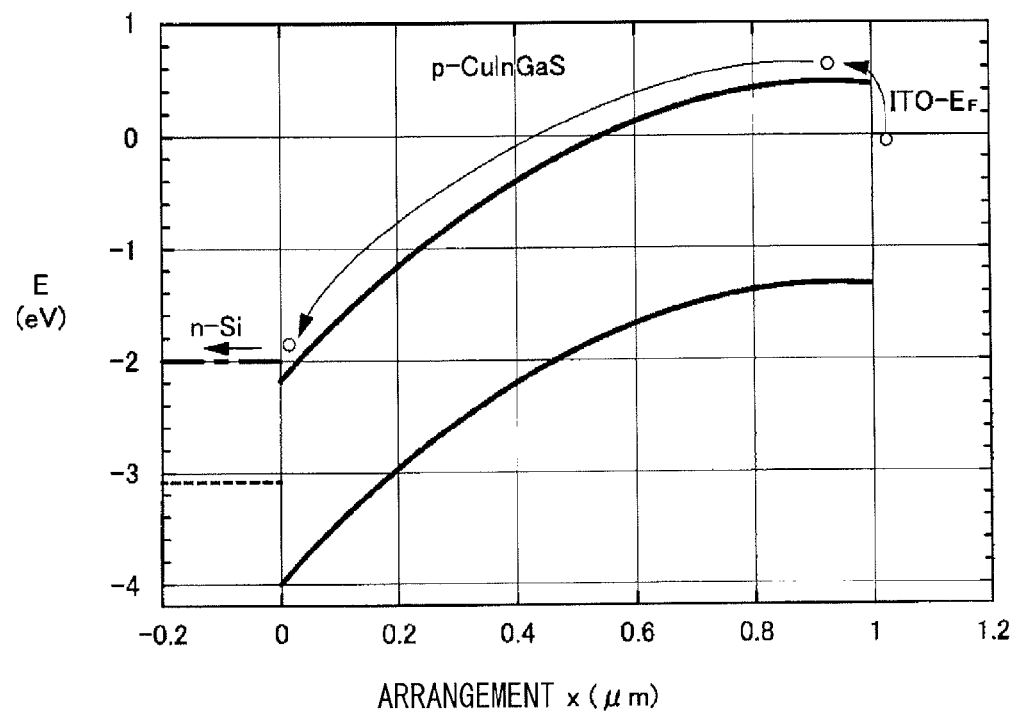
FIG. 2 is a diagram illustrating a band structure of the photoelectric conversion section and a transparent electrode in the solid-state image pickup device in the prior art as shown in FIG. 1.
Figure 3:
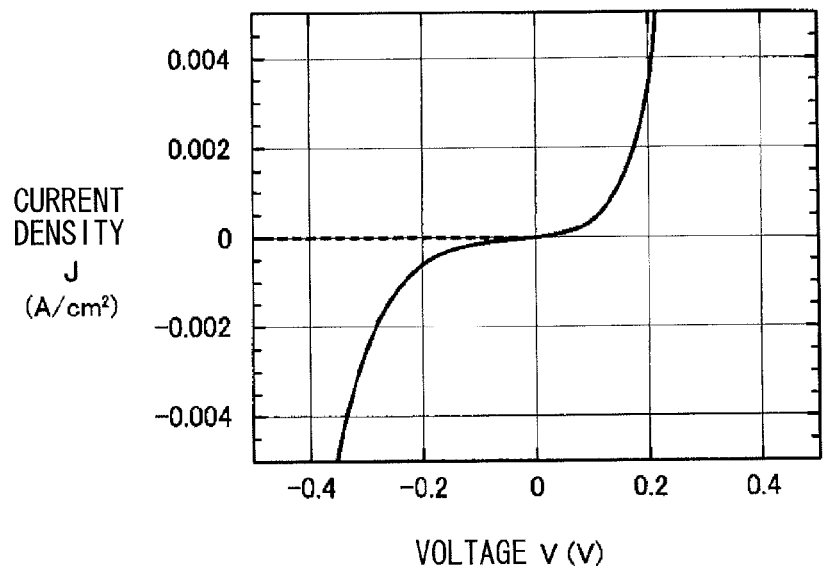
FIG. 3 is a diagram illustrating characteristics of current density and voltage of the solid-state image pickup device having a configuration in the prior art as shown in FIG. 1.

In the structure shown in FIG. 1, for example, in a case where the transparent electrode 114 is formed of ITO and the photoelectric conversion section is formed of p-type $CuIn0.48Ga0.52S$, a band structure shown in FIG. 2 is obtained when a voltage (−2V) in reverse bias is applied. In FIG. 2, Fermi level of the ITO that configures the transparent electrode 114 is set as 0eV. In this example, as shown by an arrow in FIG. 2, a phenomenon that electrons leap over a barrier at the interface from the transparent electrode 114 and are injected into the photoelectric conversion section 113 occur, upon the application of the voltage in reverse bias. FIG. 3 shows an illustrative estimated result of characteristics of current density and voltage (J-V characteristics) at this time. At the time of application of the voltage in reverse bias, the current density varies from 0to a minus-direction. In general, in a case where no electron is injected from the transparent electrode 114, the current density J is 0as shown in a dashed line in the drawing, even upon application of a reverse bias (even when the applied voltage V is a minus voltage). Therefore, it can be said that a leakage current from the ITO to the p-type CuInGaS is large in the reverse bias state in the configuration shown in FIG. 2. The description is given assuming that the voltage is in reverse bias when a minus voltage is applied to the transparent electrode side, and the voltage is in forward bias when a plus voltage is applied thereto.

The transparent electrode (p-side electrode) 114 has a function to apply a reverse bias to extract holes generated by light application, and thereby preventing the p-type photoelectric conversion section 113 from being charged. Therefore, the transparent electrode 114 may be necessary in the solid-state image pickup device. However, on the other hand, the presence of the transparent electrode 114 may disadvantageously cause injection of electrons at the same time (as used herein, at the "same time" may also mean at about the same time).

Table 1shows electron affinity X of each typical chalcopyrite material.

TABLE 1

| Material | $CuInSe_2$ | $CuGaSe_2$ | $CuInS_2$ | $CuGaS_2$ |
| --- | --- | --- | --- | --- |
| Electron affinity | 4.35 | 3.685 | 4.7 | 4.1 |
| Literature | [3] | [3] | [1] | [2] |

Figure 4:
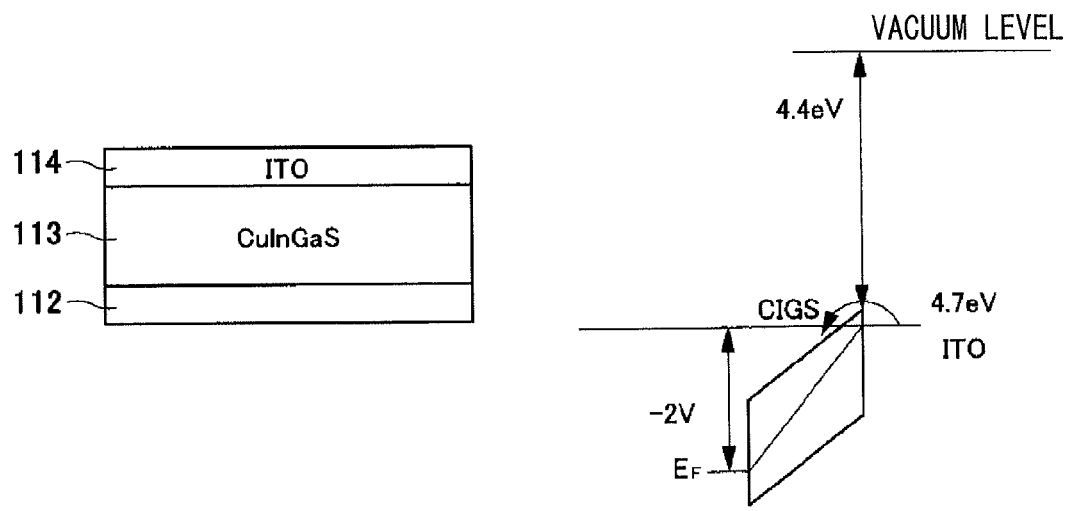
FIG. 4 is a diagram illustrating a structure of the photoelectric conversion section and the transparent electrode, and a potential of each configuration in the prior art.

As can be seen from Table 1, the electron affinity of the chalcopyrite material is large, which is from about 3.7eV to about 4.7eV both inclusive. Such a chalcopyrite material having large electron affinity forms a small barrier of 1.0eV or smaller against electrons at the Fermi level on the electrode side when the chalcopyrite material comes into contact with the p-type transparent electrode made of a material such as ITO (having work function of 4.7eV), Al:ZnO (AZO, having work function of 4.5eV), $SnO_2$ (having work function of 5.2eV), and $In_2O_3$(having work function of 5.2 eV). This is illustrated in FIG. 4. FIG. 4 shows an illustrative configuration in which the photoelectric conversion section 113 formed of the chalcopyrite material (CuInGaS having work function of 4.4eV) is provided between the lower electrode 112 and the transparent electrode 114 (ITO having work function of 4.7eV). In this configuration, as shown by an arrow, electrons are injected over a potential barrier (0.3eV) between ITO and CuInGaS. Therefore, a leakage current is caused. As described above, since the barrier between the photoelectric conversion section formed of the chalcopyrite material and the transparent electrode is small against the electrons, a leakage current may be caused as a result. This issue is unique to the chalcopyrite materials.

Examples of the chalcopyrite material may include, in addition to the above-described materials, $CuAlSe_2$, $CuAlS_2$, $CuAgSe_2$, and $CuAgS_2$, which also have high electron affinity X of a value similar to those described above. Therefore, CuInGaAlSSe-based or CuAgInGaSSe-based materials that are each mixed crystal of the above-described materials also exhibit similar electron affinity X. A composition ratio between element groups is maintained to be Group I:Group III:Group IV=1:1:2 While this ratio is maintained, the composition ratio of each element may be 0%. Specifically, Cu and Ag may be used as Group I element, In, Ga, and Al may be used as Group III element, and S and Se may be used as Group VI element.

Figure 5:
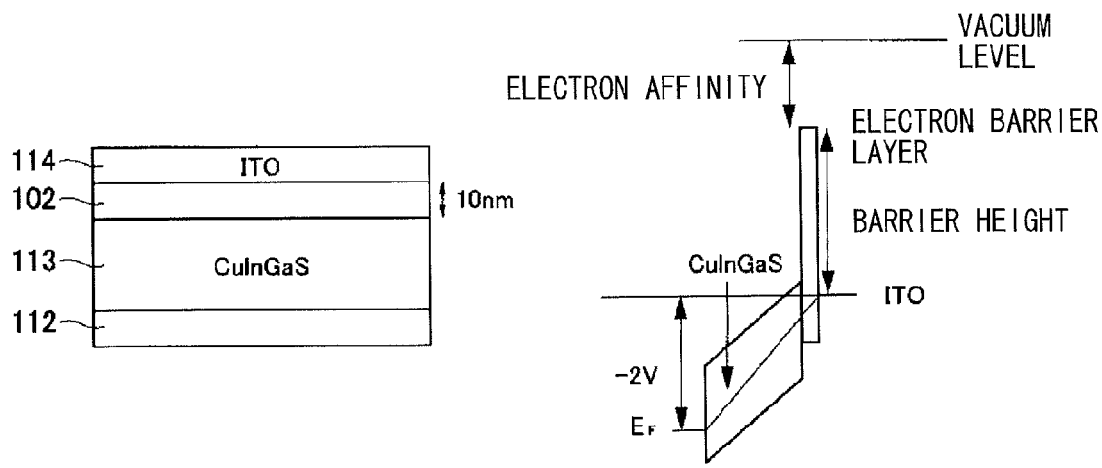
FIG. 5 is an illustrative diagram showing a structure of an electron barrier layer, the photoelectric conversion section, and the transparent electrode, and a potential of each configuration, in accordance with various embodiments of the present disclosure.

In various embodiments, in order to solve the disadvantage, or reduce the disadvantage, in the chalcopyrite material, as shown in FIG. 5, a layer (electron barrier layer) 102 that is a barrier against electrons may be inserted between the upper p-type transparent electrode 114 and the photoelectric conversion section (CuInGaS) 113 formed of the chalcopyrite material. In this structure, a potential barrier configured of the electron barrier layer 102 is additionally provided between ITO and CuInGaS. Therefore, the electron barrier layer 102 suppresses injection of the electrons over the potential barrier between ITO and CuInGaS. A difference between the Fermi level of ITO and a lower edge of conduction band of the electron barrier layer 102 is a barrier height.

Figure 6:
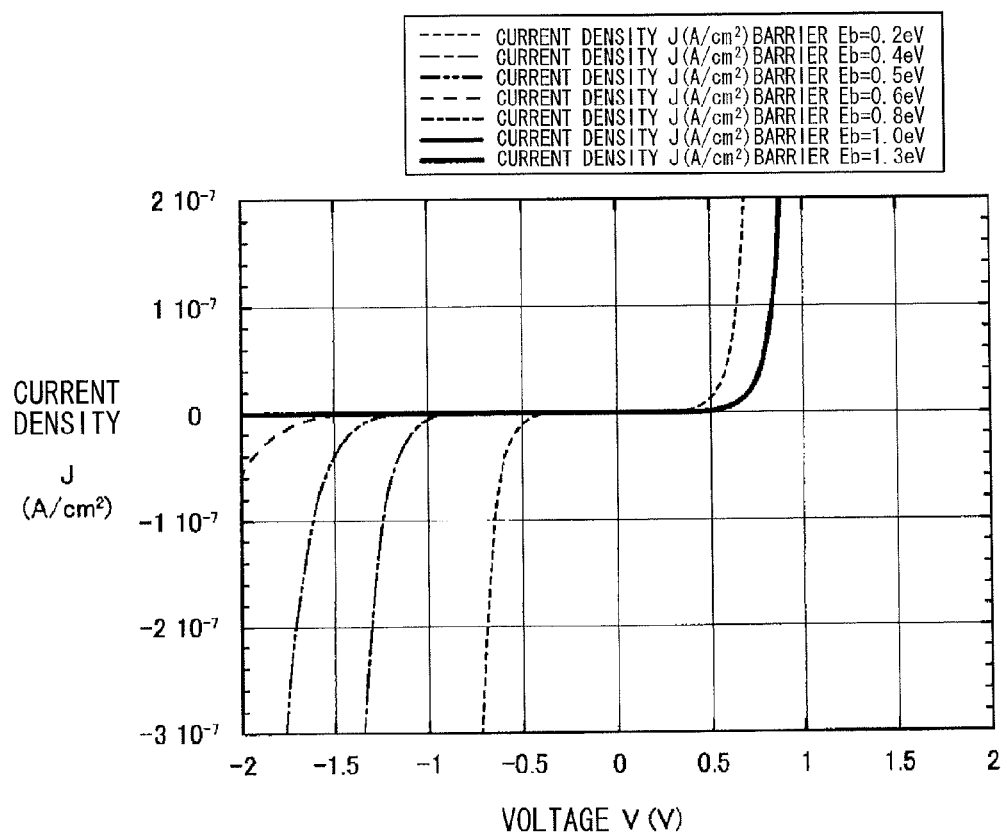
FIG. 6 is an illustrative diagram showing characteristics of current density and voltage of the structure shown in FIG. 5, in accordance with various embodiments of the present disclosure.

FIG. 6 shows illustrative characteristics of current density and voltage (J-V characteristics) when, in this structure, a thickness of the electron barrier layer 102 is 10nm and the barrier is varied from 0 to 1.3eV. The voltage is in reverse bias when a minus voltage is applied to the transparent electrode 114 side, and the voltage is in forward bias when a plus voltage is applied to the transparent electrode 114 side. In a minus region, current density is described as "lower" as the current density is closer to 0, and is described as "higher" as a numerical value in minus is larger. In other words, the current density is described as "lower" as the current density is closer to 0 in both plus and minus regions. This simulation is based, for example, on the emission theory of Bethe taking into consideration tunnel effect.

In various embodiments, when the barrier of the electron barrier layer 102 is 0.6eV or larger, the current density J is $1*10^{-7} A/cm^2$ or smaller even under application of a voltage of −2V. This value of about $1*10^{-7} A/cm^2$ or smaller may be a necessary condition for preventing an image sensor from being saturated, or substantially saturated, by a dark current. In this case, holes generated due to light application in $CuInGaS_2$ may be extracted to the transparent electrode 114 side by providing the band structure that does not become a barrier as shown in FIG. 5. For example, an upper edge of a valence band of the electron barrier layer 102 is above an upper edge of a valence band of $CuInGaS_2$ Therefore, the electron barrier layer 102 does not serve as a barrier against the holes that are extracted from $CuInGaS_2$ to the transparent electrode 114.

Figure 7:
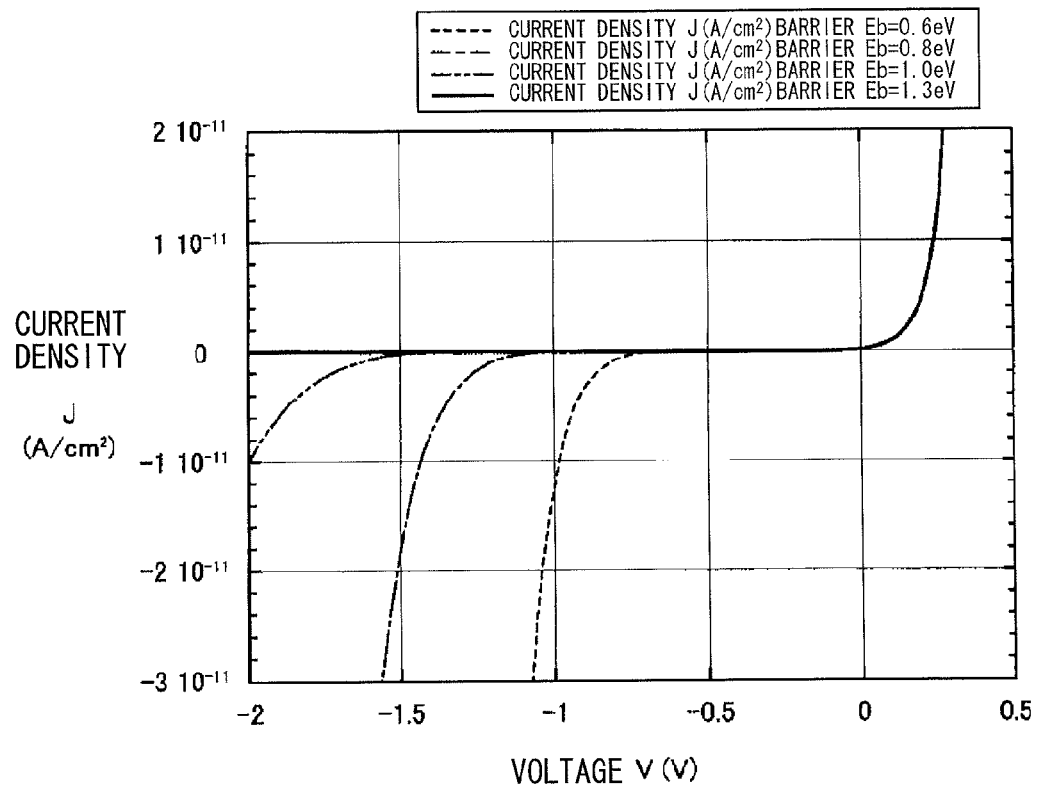
FIG. 7 is an illustrative enlarged diagram showing the characteristics of current density and voltage shown in FIG. 6, in accordance with various embodiments of the present disclosure.

FIG. 7 shows an illustrative enlarged graph shown in FIG. 6 of a region where the current density is small and the barrier is from 0.6eV to 1.3eV both inclusive. When the barrier is 1.0eV or larger, the current density is J is $1*10^{-11} A/cm^2$ or smaller, even under application of a voltage of −2V. When the current density J is $1*10^{-11} A/cm^2$ or smaller, electrons are accumulated as dark current even when shooting is performed at a normal shutter speed of 1/30 second. Therefore, the value of $1*10^{-11} A/cm^2$ or smaller may be a sufficient or improved condition for an image sensor.

As can be seen from the results shown in FIGS. 6 and 7, for example, a barrier of 0.6eV or larger serves as a barrier against electrons injected from the transparent electrode 114 to the photoelectric conversion section 113 in an image sensor. In other words, the barrier of 0.6eV or larger may be effective as the electron barrier layer 102. The barrier may also be 1.0eV or larger, since a sufficient or improved effect as an image sensor may thereby be expected. A barrier of 0.5eV or smaller has no effect as a barrier. Therefore, when the barrier against holes is of 0.5eV or smaller, the barrier does not prevent holes from being extracted from the photoelectric conversion section 113 to the transparent electrode 114.

Examples of materials that may be used for the above-described electron barrier layer 102 may include materials shown in Table 2 In particular, NiO has small electron affinity of 1.5eV and has a large band gap of 4.0eV. Therefore, NiO may serve as a barrier (e.g., 3.2 eV) with respect to the Fermi level of the transparent electrode 114 (for example, work function of 4.7eV of ITO).

TABLE 2

| Material | Electron affinity (eV) | Band gap (eV) |
| --- | --- | --- |
| NiO | 1.5 | ~4.0 |
| $Cu_2O$ | ~3.4 | ~2.1 |
| $ZnRh_2O_4$ | ~2.3 | ~2.2 |

Figure 8:
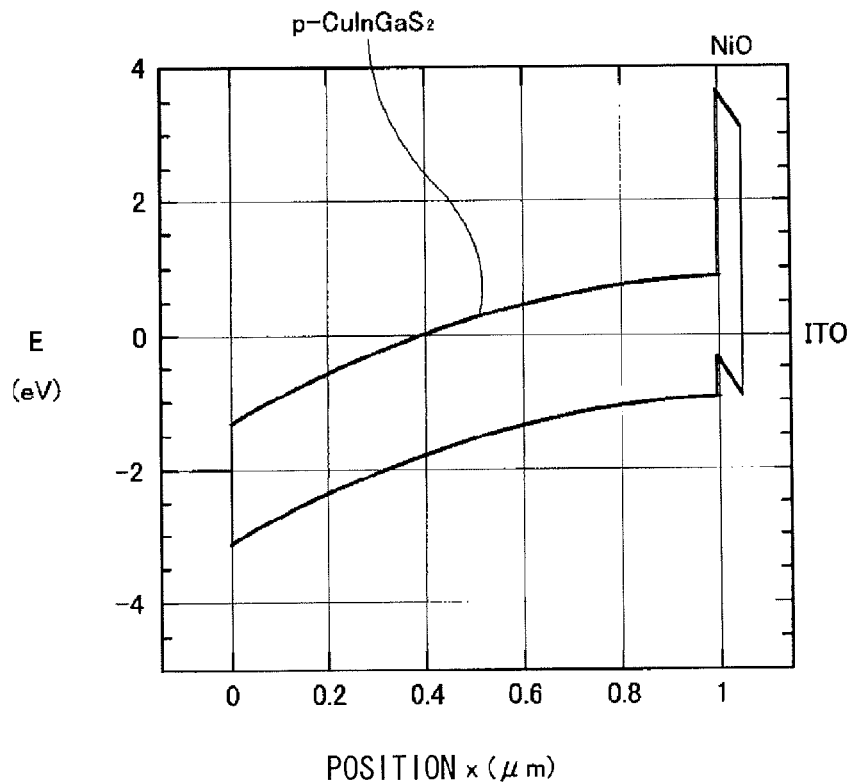
FIG. 8 is an illustrative diagram showing a band structure in the structure (NiO) shown in FIG. 5, in accordance with various embodiments of the present disclosure.

FIG. 8 shows an illustrative band structure when the transparent electrode 114 is formed of ITO and the electron barrier layer 102 is formed of NiO in the structure shown in FIG. 5, and a voltage (−2V) of a reverse bias is applied. As can be seen from this result, for example, NiO may serve as the barrier layer even under application of a reverse bias. Further, in some embodiments, a small part that serves as the barrier against holes exists on the ITO side of the electron barrier layer 102. However, this part may be sufficiently small (e.g., 0.5eV or smaller), to not become a barrier against extraction of holes.

Figure 9:
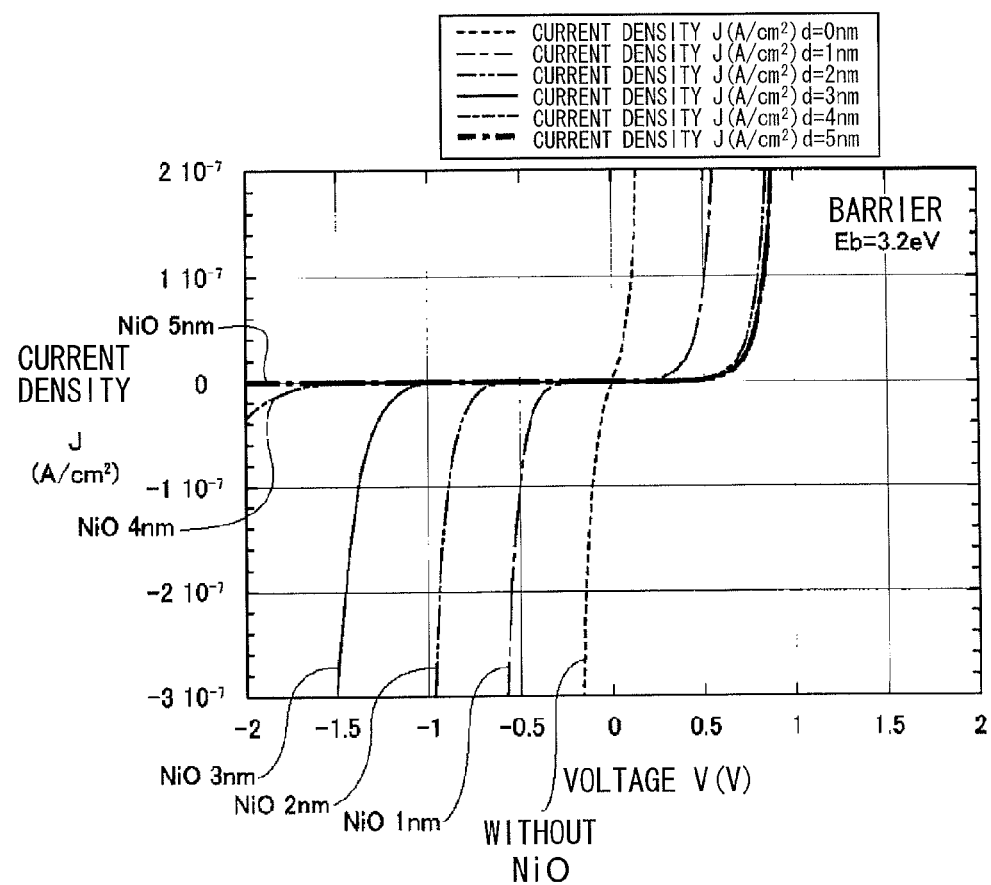
FIG. 9 is an illustrative diagram showing characteristics of current density and voltage of the structure (NiO) shown in FIG. 5, in accordance with various embodiments of the present disclosure.

FIG. 9 shows an illustrative result in which the J-V characteristics are estimated taking into consideration the tunnel effect. As can be seen from this result, when the electron barrier layer 102 of NiO is 4nm or larger, the current density J is $1*10^{-7} A/cm^2$ or smaller, even under application of a voltage of −2V. This value of $1*10^{-7} A/cm^2$ or smaller may be a necessary condition for preventing an image sensor from being saturated, or substantially saturated, by a dark current when an image sensor is used in a normal range, for example, at an exposure time of 1/30 second.

Figure 10:
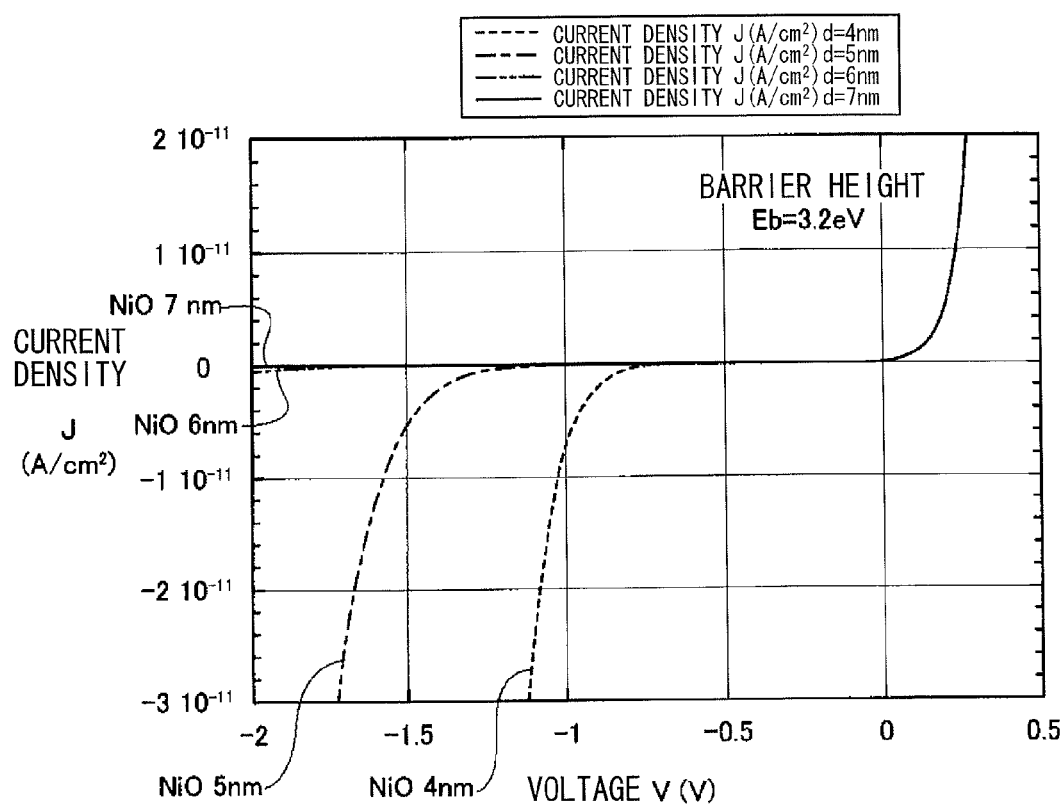
FIG. 10 an illustrative enlarged diagram showing characteristics of current density and voltage shown in FIG. 9, in accordance with various embodiments of the present disclosure.

FIG. 10 shows an illustrative enlarged graph of a region in which the thickness of the electron barrier layer (NiO) 102 is in a range from 4nm to 7nm both inclusive, and the current density is small. When the thickness of NiO is 6nm or larger, the current density J is $1*10^{-11}$A/cm$^2$ or smaller, even under application of a voltage of −2V. When the current density J is $1*10^{-11}$A/cm$^2$ or smaller, electrons are accumulated as dark current even when shooting is performed at a normal shutter speed of 1/30 second. Therefore, the value of $1*10^{-11}$A/cm$^2$ or smaller may be a sufficient or improved condition for an image sensor.

Figure 11:
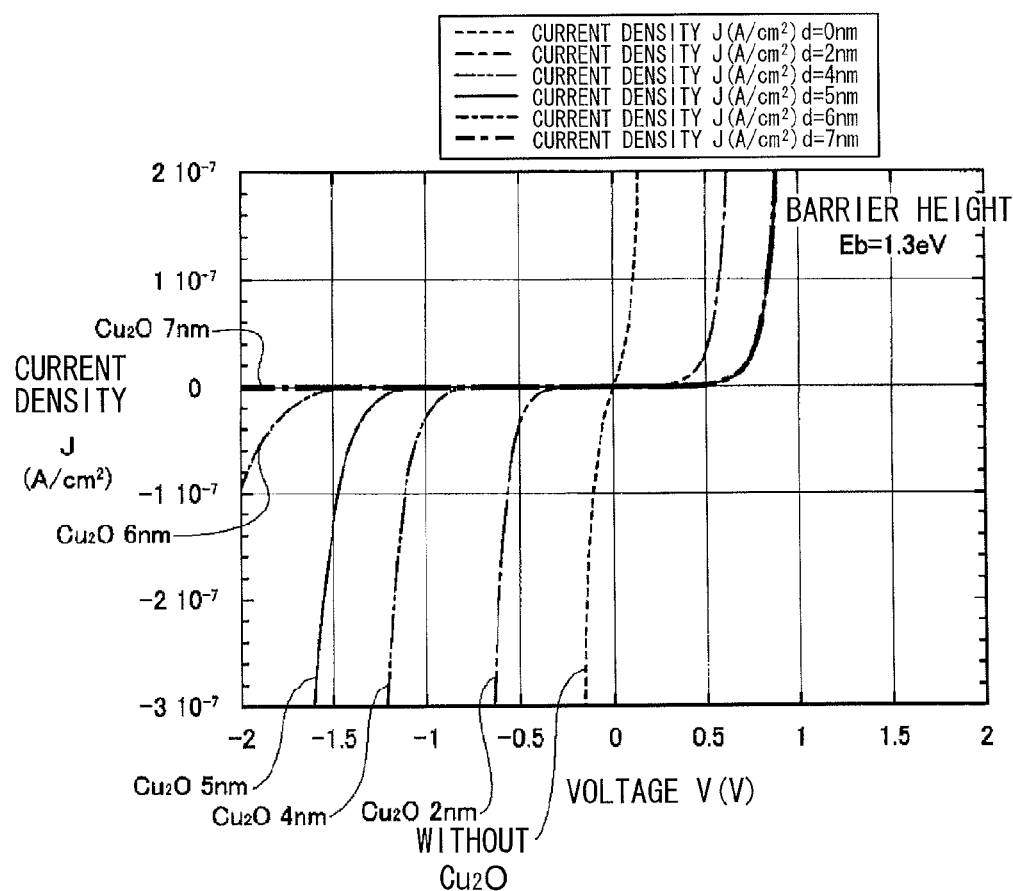
FIG. 11 is an illustrative diagram showing characteristics of current density and voltage (tunnel effect) of a structure ($Cu_2O$) shown in FIG. 5, in accordance with various embodiments of the present disclosure.

Next, an illustrative example will be described in which the electron barrier layer 102 is formed of Cu$_2$O in the structure shown in FIG. 5. Also in this case, the electron barrier layer 102 may serve as a barrier (e.g., 1.3eV) with respect to the Fermi level of the transparent electrode 114 (for example, work function of 4.7eV of ITO). FIG. 11 shows an illustrative result in which the J-V characteristics are estimated when the transparent electrode 114 is formed of ITO, the electron barrier 102 is formed of Cu$_2$O, and tunnel effect under reverse-bias application is taken into consideration. As can be seen from this result, for example, by allowing the electron barrier layer (Cu$_2$O) 102 to have a thickness of 6nm or larger, the current density J becomes $1*10^{-7}$A/cm$^2$ or smaller even under application of a voltage of −2V. This value of $1*10^{-7}$A/cm$^2$ or smaller may be a necessary condition for preventing an image sensor from being saturated, or substantially saturated, by a dark current when the image sensor is used in a normal range, for example, at an exposure time of 1/30 second. One of the reasons why it may be necessary to allow Cu$_2$O to be thicker than NiO is that the barrier of Cu$_2$O is 1.3eV, which is smaller by 1.9eV than the barrier of NiO, and therefore, tunnel current is increased.

Figure 12:
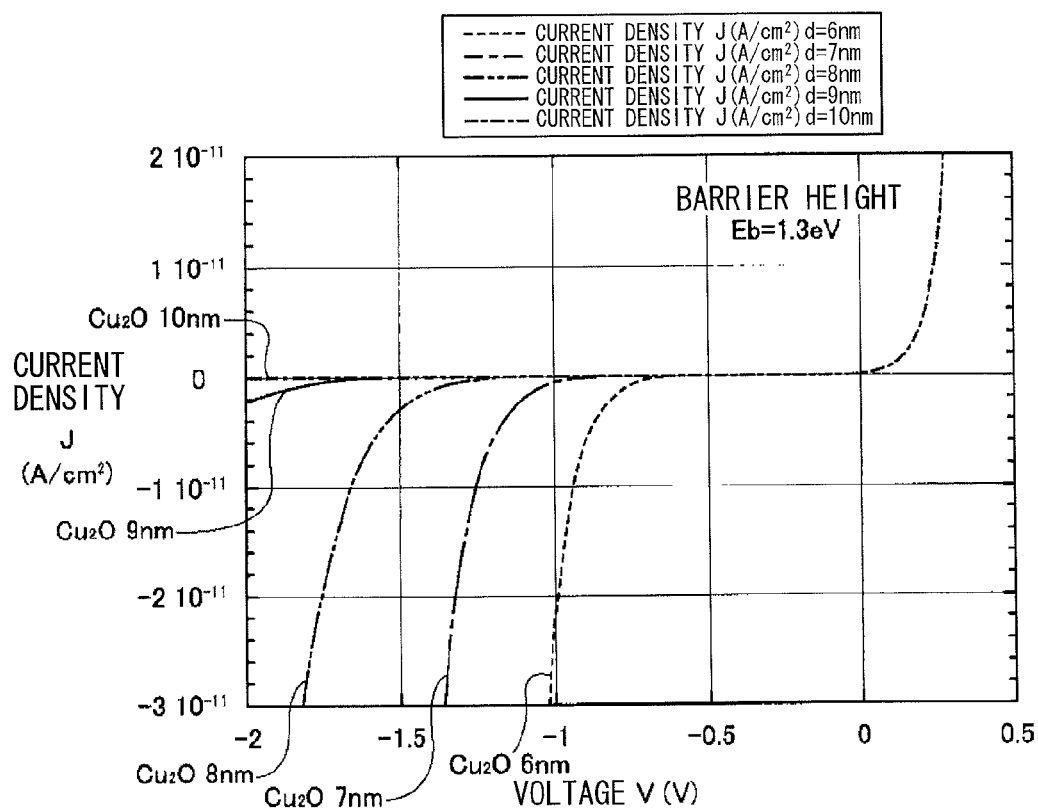
FIG. 12 an illustrative enlarged diagram showing characteristics of current density and voltage shown in FIG. 11, in accordance with various embodiments of the present disclosure.

FIG. 12 shows an illustrative enlarged graph of a region in which the thickness of Cu$_2$O is varied from 6nm to 10nm both inclusive, and the current density is small. When the thickness of Cu$_2$O is 9nm or larger, the current density J is $1*10^{-11}$A/cm$^2$ or smaller, even under application of a voltage of −2V. When the current density J is $1*10^{-11}$ A/cm$^2$ or smaller, electrons are accumulated as dark current even when shooting is performed at normal shutter speed of 1/30 second. Therefore, the value of $1*10^{-11}$A/cm$^2$ or smaller may be a sufficient or improved condition for an image sensor.

Figure 13:
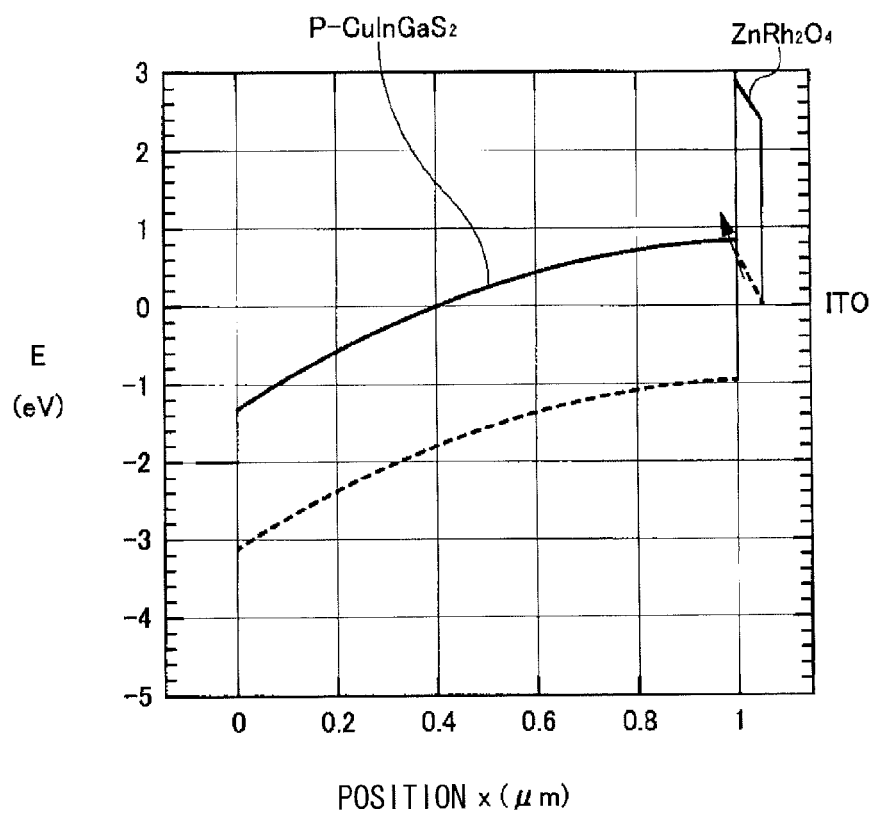
FIG. 13 is an illustrative diagram showing characteristics of current density and voltage (tunnel effect) of a structure ($ZnRh_2O_4$) shown in FIG. 5, in accordance with various embodiments of the present disclosure.
Figure 14:
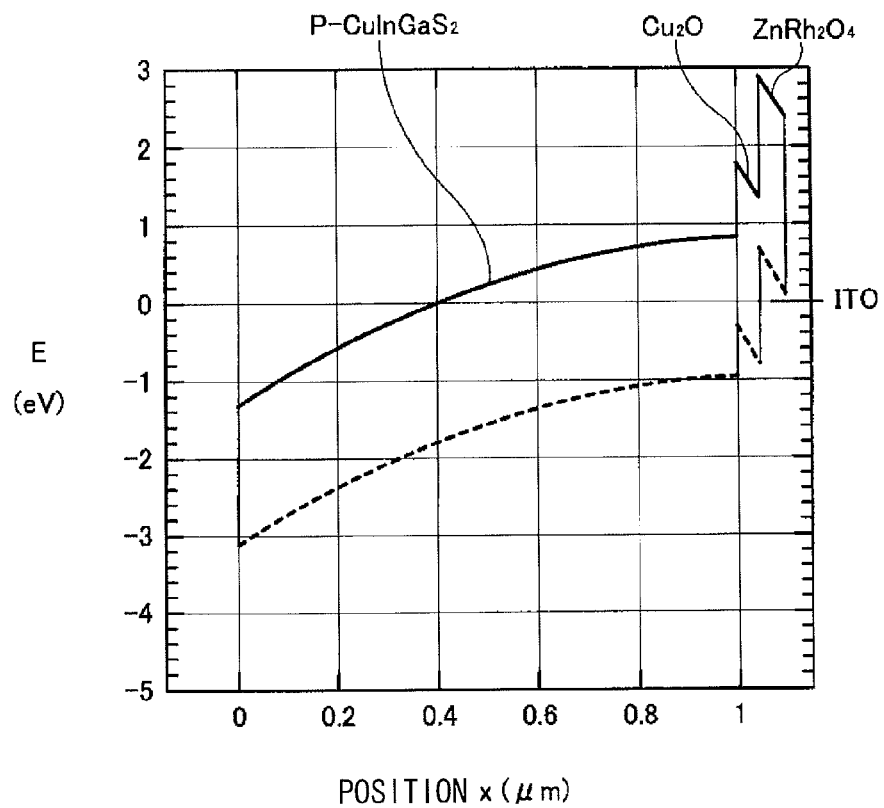
FIG. 14 is an illustrative diagram showing characteristics of current density and voltage (tunnel effect) of a structure ($Cu_2O/ZnRh_2O_4$) shown in FIG. 5, in accordance with various embodiments of the present disclosure.

In the above description of illustrative embodiments, one type of material is used for the electron barrier layer 102. However, in further illustrative embodiments, two or more types of materials may be laminated. For example, Cu$_2$O and ZnRh$_2$O$_4$ may be laminated to form the electron barrier layer 102. In a case where the electron barrier layer 102 is configured only of ZnRh$_2$O$_4$, as shown by an arrow in FIG. 13, a leakage current may be caused from a valence band of the electron barrier layer (ZnRh$_2$O$_4$) to a conduction band side of the chalcopyrite material (p-CuInGaS). Therefore, as shown in FIG. 14, by laminating Cu$_2$O on ZnRh$_2$O$_4$ to form the electron barrier layer 102, the barrier against electrons becomes more effective. FIG. 14 shows an illustrative case in which a voltage (−2V) in reverse bias is applied to a structure of [p-CuInGaS$_2$/Cu$_2$O/ZnRh$_2$O$_4$/ITO]. However, a structure including three or more layers such as [p-CuInGaS$_2$/Cu$_2$O/ZnRh$_2$O$_4$/Cu$_2$O/ITO] may be adopted in further embodiments. Alternatively, a similar effect may be obtained when the order of lamination is [p-CuInGaS$_2$/ZnRh$_2$O$_4$/Cu$_2$O/ITO]. Also in the illustrative configuration as shown in FIG. 14, when each layer configuring the electron barrier layer 102, for example, each of the layers of ZnRh$_2$O$_4$ and Cu$_2$O has a barrier of 0.5eV or smaller, the layer does not serve as a barrier against holes.

As described herein, according to the above embodiments of the present technology, there is provided, between the photoelectric conversion section 113 formed of the chalcopyrite material and the p-type transparent electrode 114, the electron barrier layer 102 that has the barrier height, of 0.6eV or larger, against electrons from the Fermi level of the p-type transparent electrode 114 and is of 0.5eV or smaller so as not to serve as a barrier against holes that are injected from the photoelectric conversion section 113 to the transparent electrode 114. According to this structure, even when a voltage in reverse bias is applied to the chalcopyrite-based photoelectric conversion section for reading a signal, the electron barrier layer suppresses, or improves by partially suppressing, the leakage current caused by electrons. Moreover, the electron barrier layer does not serve as a barrier against holes generated in the photoelectric conversion section by light application. Therefore, the holes are extracted to the transparent electrode, and thus, for example, the holes are not charged. As a result, a solid-state image pickup device having a high S/N ratio and a high or improved image quality is configured.

Figure 15:
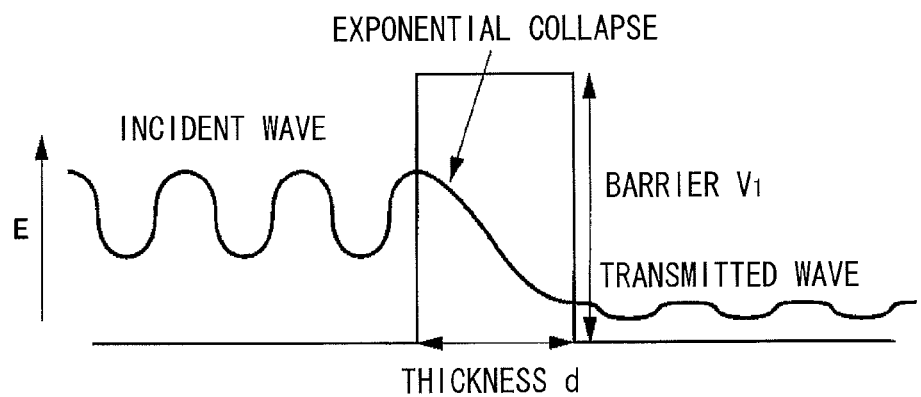
FIG. 15 is an illustrative diagram for explaining tunnel effect, in accordance with various embodiments of the present disclosure.

In the above-described simulation, Schrodinger wave function of an electron exponentially collapses, because of the tunnel effect, in the barrier layer when the energy barrier is present as shown in FIG. 15. However, the electron is transmitted through the barrier to the outside, and the electron has the energy that it has when it gets out of the barrier layer. Therefore, a thin barrier layer does not serve as a barrier. Also, when the barrier V1 is not high or sufficiently high, the barrier layer also does not serve as a barrier. Tunneling probability P may be represented by the following expression with respect to the thickness d of the barrier layer.

$$P = \frac{4\alpha^2\beta^2}{4\alpha^2\beta^2 + (\alpha^2 + \beta^2)^2 \sinh^2 \beta d}$$

$$\alpha^2 = \frac{2m}{\hbar^2} E$$

$$\beta^2 = \frac{2m}{\hbar^2}(V_1 - E)$$

Further, the emission theory of Bethe in this illustrative example is based on the emission theory of Bethe taking into consideration the tunnel effect. The current density at the semiconductor interface of the electrode and the semiconductor is determined based on kinetic energy of a carrier and barrier height Hns at the interface. Therefore, the current density with respect to voltage may be represented by the following expression, where A* is called Richardson constant.

$$J = A^* T^2 \exp\left(-\frac{\phi_{ns}}{kT}\right)\left[\exp\left(\frac{eV}{kT}\right) - 1\right]$$

A* is represented by the following expression, where m* is the effective mass of the electron.

$$A^* = \frac{4\pi e m^* k^2}{h^3}$$

2. First Embodiment (Solid-State Image Pickup Device)

Figure 16:
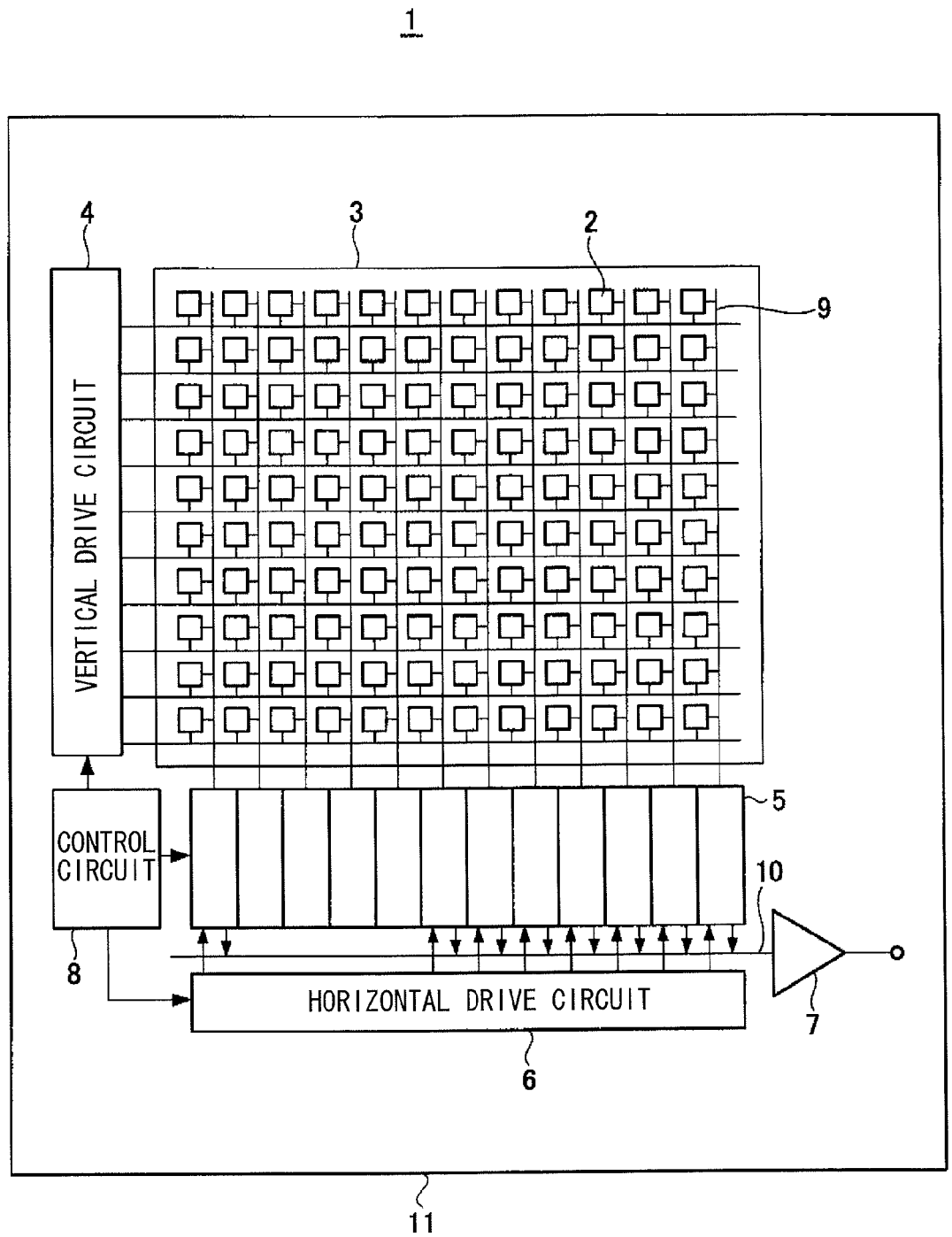
FIG. 16 is an illustrative schematic configuration diagram showing a solid-state image pickup device according to a first embodiment, in accordance with various embodiments of the present disclosure.

Next, an illustrative description will be given of a first embodiment of a solid-state image pickup device. FIG. 16 shows an illustrative schematic configuration diagram (e.g., a plan view) of a solid-state image pickup device according to the first embodiment. The present embodiment is an application to a CMOS-type image sensor. As shown in FIG. 16, a solid-state image pickup device 1 according to the present embodiment includes a pixel region 3, a vertical drive circuit 4, a column signal processing circuit 5, a horizontal drive circuit 6, an output circuit 7, and a control circuit 8, that are arranged on a substrate 11 made of silicon. The pixel region 3 includes a plurality of pixels 2.

Each pixel 2 includes a photoelectric conversion section formed of, for example, a photodiode and a plurality of pixel transistors. The plurality of pixels 2 are arranged regularly in a two-dimensional array state on the substrate 11. Examples of the pixel transistor configuring the pixel 2 may include a transfer transistor, a reset transistor, a selection transistor, and an amplifier transistor.

The pixel region 3 includes the plurality of pixels 2 that are regularly arranged in a two-dimensional array state. The pixel region 3 includes an effective pixel region and a black reference pixel region (not illustrated). The effective pixel region amplifies a signal charge generated through photoelectric conversion of incident light and reads out the amplified signal charge to the column signal processing circuit 5. The black reference pixel region is provided for outputting an optical black level that is used as the reference of black level. The black reference pixel region is typically formed on an outer peripheral part of the effective pixel region.

The control circuit 8 generates signals such as clock signals and control signals based on vertical synchronization signals, horizontal synchronization signals, and master clocks. The vertical drive circuit 4, the column signal processing circuit 5, the horizontal drive circuit 6, etc. operate based on the above-described signals such as the clock signals and the control signals. The signals, such as the clock signals and the control signals generated in the control circuit 8, are inputted to the vertical drive circuit 4, the column signal processing circuit 5, the horizontal drive circuit 6, etc.

The vertical drive circuit 4 may be configured, for example, of a shift resistor. The vertical drive circuit 4 selectively scans the respective pixels 2 in the pixel region 3 in a row unit in a sequential manner in a vertical direction. The vertical drive circuit 4 supplies pixel signals, based on the signal charge generated in the photodiode in the respective pixels 2 in accordance with an amount of received light, to the column signal processing circuit 5 via vertical signal lines 9.

The column signal processing circuit 5 may be, for example, arranged for each column of the pixels 2. The column signal processing circuit 5 performs signal processing such as denoising and signal amplification on the signal outputted from the pixels 2 in one row, based on the signals supplied from the black reference pixel region (which is not illustrated but is formed in an outer peripheral part of the effective pixel region, for example) for each pixel column. At an output stage of the column signal processing circuit 5, a horizontal selection switch (not illustrated) is provided between the column signal processing circuit 5 and a horizontal line 10.

The horizontal drive circuit 6 may be configured, for example, of a shift resister. The horizontal drive circuit 6 sequentially outputs horizontal scanning pulses to sequentially select the respective column signal processing circuits 5, and thereby allowing pixel signals to be outputted from the respective column signal processing circuits 5 to the horizontal signal line 10.

The output circuit 7 performs signal processing on the signals supplied from the respective column signal processing circuits 5 via the horizontal signal line 10 and outputs the processed signals.

(Pixel Configuration)

Figure 17:
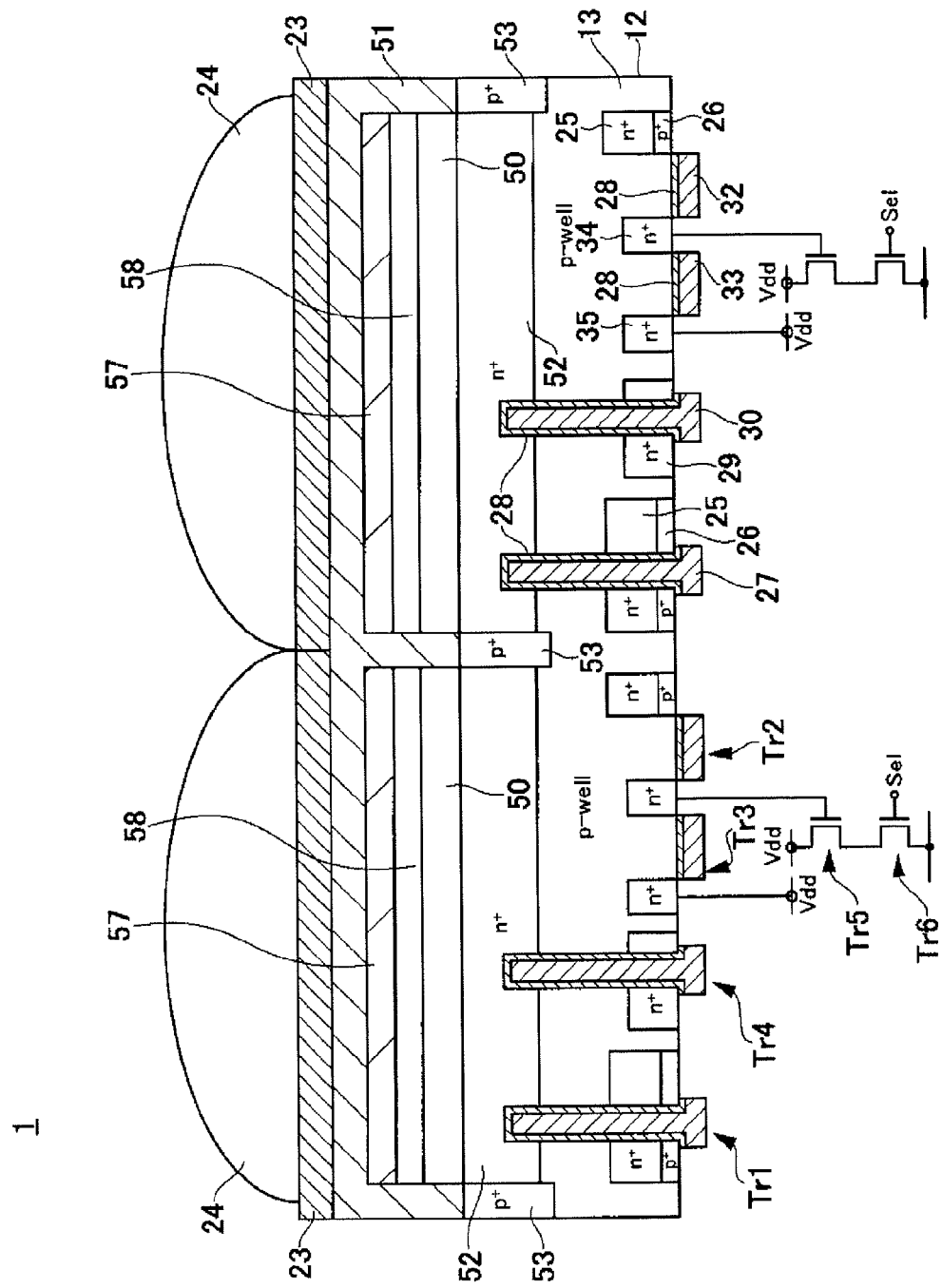
FIG. 17 is an illustrative diagram showing a cross-sectional view of a pixel region in the solid-state image pickup device according to the first embodiment, in accordance with various embodiments of the present disclosure.
Figure 18:
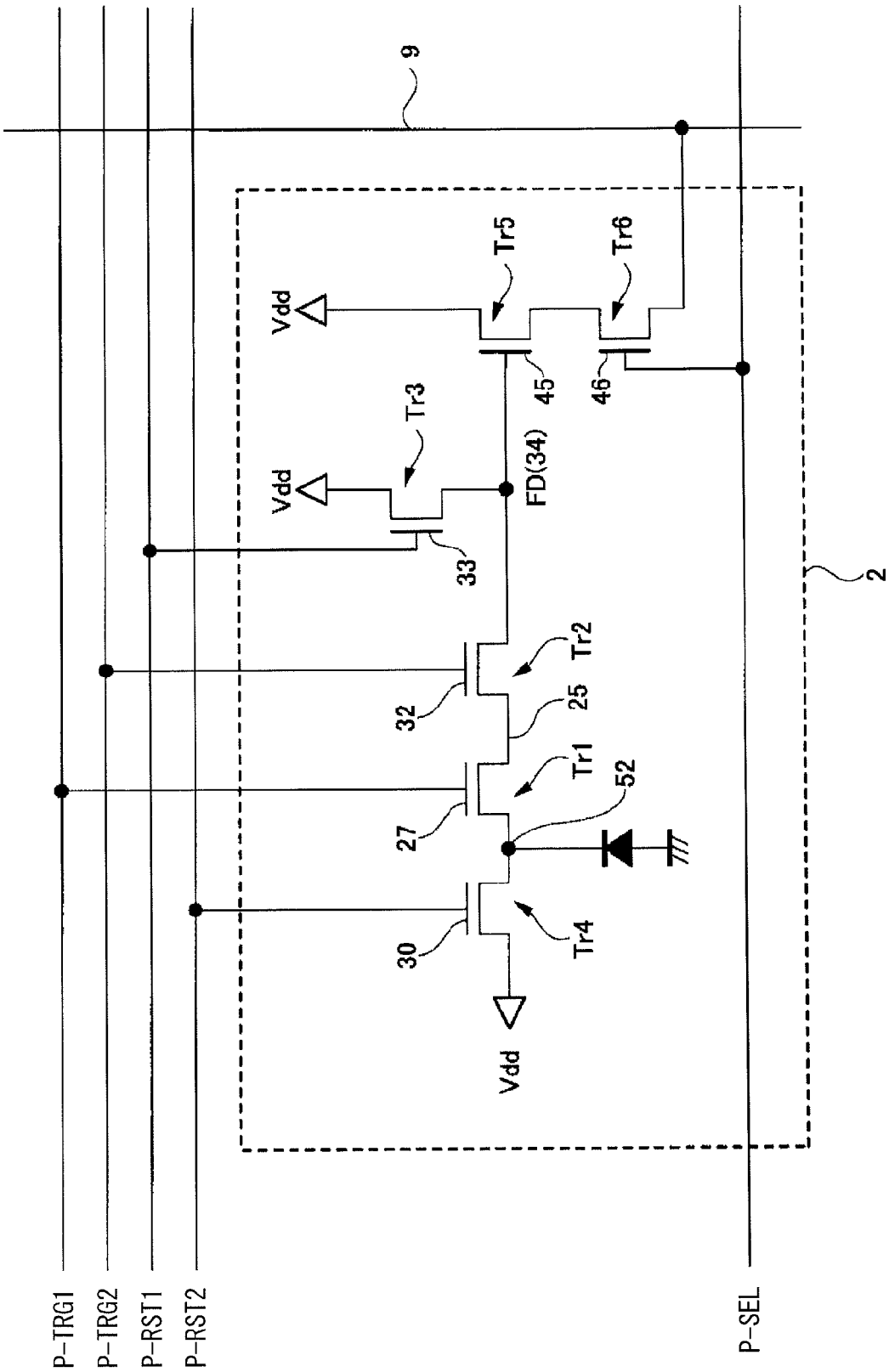
FIG. 18 is an illustrative diagram showing an equivalent circuit diagram of a pixel in the solid-state image pickup device according to the first embodiment, in accordance with various embodiments of the present disclosure.

Next, a configuration of each pixel 2 in the solid-state image pickup device 1 according to the present embodiment will be described. For example, the solid-state image pickup device 1 according to the present embodiment has a back face illumination structure in which a front face side of the semiconductor substrate serves as a circuit formation face and a back face side thereof serves as a light incident face. FIG. 17 is an illustrative schematic cross-sectional view in the pixel region 3 of the solid-state image pickup device 1 according to the present embodiment. FIG. 18 is an equivalent illustrative circuit diagram of each pixel 2 in the solid-state image pickup device 1 according to the present embodiment. In FIG. 17, part of the pixel transistors configuring each pixel 2 is illustrated in a circuit diagram form.

As shown in FIG. 17, the solid-state image pickup device 1 according to the present embodiment includes, for example, a substrate 12 provided with a first charge accumulation section 52, a second charge accumulation section 25, a floating diffusion section 34, and the plurality of pixel transistors. Further, the solid-state image pickup device 1 according to the present embodiment includes a wiring layer which is not illustrated on a front face side of the substrate 12. Further, the solid-state image pickup device 1 includes a photoelectric conversion section 50, an electron barrier layer 58, a transparent electrode 57, a color filter layer 23, an on-chip lens 24 that are laminated on a back face side of the substrate 12 that serves as the light incident face.

The substrate 12 is configured of an n-type semiconductor substrate (such as an n-type silicon substrate), and may have a thickness of, for example, 3 micrometers to 5 micrometers both inclusive. The pixel region 3 in which an impurity region configuring each pixel 2 is formed is a well region 13 of a second conductivity type (e.g., p type, in the present embodiment). The respective pixels 2 are partitioned by pixel separation sections 53 formed in the substrate 12. The pixel separation section 53 is formed of a p-type semiconductor layer having high concentration that is formed from the back face side of the substrate 12 so as to have a desirable depth. The pixel separation section 53 electrically separates the adjacent pixels from each other.

In the p-type well region 13, the first charge accumulation section 52, the second charge accumulation section 25, the floating diffusion section 34, and source-drain regions 29 and 35 configuring each pixel transistors, that configure each pixel 2 are formed. Each pixel 2 includes six pixel transistors, that are, a first transfer transistor Tr1, a second transfer transistor Tr2, a first reset transistor Tr3, a second reset transistor Tr4, an amplifier transistor Tr5, and a selection transistor Tr6.

The first charge accumulation section 52 is configured of an n-type semiconductor layer that is formed from the back face side (e.g., light incident face side) of the substrate 12 to have a predetermined depth. The first charge accumulation section 52 is formed for each corresponding pixel. In each pixel, the first charge accumulation section 52 is formed in an entire region of a unit pixel region partitioned by the pixel separation section 53. The first charge accumulation section 52 serves as an accumulation section that accumulates signal charge generated in the photoelectric conversion section 50, which will be described later.

The first charge accumulation section 52 may have a configuration in which impurity is so distributed as to allow concentration of the n-type impurity becomes higher from the back face side of the substrate in the depth direction. Such a configuration allows the first charge accumulation section 52 to have potential gradient in which electric potential becomes higher in the depth direction of the substrate 12. Thus, due to the potential gradient, an internal electric field is generated in the substrate. Due to this internal electric field, the signal charge (e.g., electrons, in the present embodiment) that has been moved from the photoelectric conversion section 50 moves by itself toward the front face side of the substrate 12 in the first accumulation section 52.

The second charge accumulation section 25 is configured of an n-type semiconductor layer that is formed on the front face side (e.g., opposite side from the light incident side) of the substrate 12. The second accumulation section 25 is arranged at a position in the depth direction (e.g., the thickness direction) of the substrate 12 in which a planar position of the second accumulation section 25 overlaps a planar position of the first charge accumulation section 52. In other words, the second charge accumulation section 25 is formed on a front face side of the first charge accumulation section 52 in the depth direction of the substrate 12. In this case, the n-type semiconductor layer configuring the first charge accumulation section 52 is so arranged as to be electrically separated from the n-type semiconductor layer configuring the second charge accumulation section 25 via the p-type well region 13. In order to more precisely read the signal charge from the first charge accumulation section 52 to the second charge accumulation section 25 (that is, in order to reduce signal charge remained not transferred), concentration of an impurity in the second charge accumulation section 25 may be desirably higher than that in the first charge accumulation section 52.

A thin p-type semiconductor layer 26 is formed closer to the front face than the n-type semiconductor layer configuring the second charge accumulation section 25 and is formed so as to be in contact with the second charge accumulation section 25. This p-type semiconductor layer 26 suppresses occurrence of a dark current caused at the interface of the substrate and an oxide film configuring the wiring layer (not illustrated) formed on the front face side of the substrate 12.

In FIG. 17, in various embodiments, the second charge accumulation section 25 and the p-type semiconductor layer 26 are formed in each of the right and left portions of each of the two pixels. The second charge accumulation section 25 and the p-type semiconductor layer 26 are formed all around the peripheral part of the pixel, and parts formed in the respective right and left portions of the pixel are connected to each other in positions not shown in FIG. 17 to be formed integrally.

The floating diffusion section 34 is formed near the front face in the substrate 12. The floating diffusion section 34 is configured of an n-type semiconductor layer having a high concentration. In addition thereto, the source-drain region configuring each pixel transistor is formed near the front face in the substrate 12. In FIG. 17, drains 35 and 29 that configure the first reset transistor Tr3 and the second reset transistor Tr4, respectively, are illustrated as representatives.

The source-drain region configuring each pixel transistor is also configured of an n-type semiconductor layer having high concentration as with the floating diffusion section 34. The floating diffusion section 34 and the source-drain region configuring each pixel transistor are each also formed at a position in the depth direction of the substrate 12 that overlaps the position of the first charge accumulation section 52. The n-type semiconductor layer in the floating diffusion section 34 is formed so as not to be connected to the n-type semiconductor layer in the source-drain region via the p-type well region 13.

The first transfer transistor Tr1 includes, for example, the first charge accumulation section 52, the second charge accumulation section 25, and a first transfer gate electrode 27. The first charge accumulation section 52 serves as a source, and the second charge accumulation section 25 serves as a drain. The first transfer gate electrode 27 configuring the first transfer transistor Tr1 is a vertically-extending gate electrode that is formed from the front face side of the substrate 12 in the depth direction. Further, the first transistor gate electrode 27 has a depth that allows the first transistor gate electrode 27 to run through the second charge accumulation section 25 and to reach the first charge accumulation section 52. The first transfer gate electrode 27 is formed by filling, with an electrode material, a trench formed at a desirable depth from the front face of the substrate 12 with a gate insulating film 28 in between.

Although not illustrated in FIG. 17, a thin p-type semiconductor layer may be formed on side faces and on bottom face of the trench when the first transfer gate electrode 27 is formed. By forming the thin p-type semiconductor layer on the side faces and on the bottom face of the trench, occurrence of the dark current at the interface of the trench and the substrate 12 is suppressed or reduced.

As shown in the illustrative embodiments in FIG. 18, the first transfer gate electrode 27 is connected to a wire that supplies a first transfer pulse P-TRG1. In the first transfer transistor Tr1, the desirable first transfer pulse P-TRG1 is applied to the first transfer gate electrode 27, and thereby, the signal charge accumulated in the first charge accumulation section 52 is read out to the second charge accumulation section 25. In this case, a channel is formed along the first transfer gate electrode 27, and the signal charge moves toward the second charge accumulation section 25 along the first transfer gate electrode 27.

The second transfer transistor Tr2 includes the second charge accumulation section 25, the floating diffusion section 34, and a second transfer gate electrode 32. The second charge accumulation section 25 serves as a source, and the floating diffusion section 34 serves as a drain. The second transfer gate electrode 32 configuring the second transfer transistor Tr2 may be formed on the front face of the substrate 12 between the source and the drain, for example, with the gate insulating film 28 formed of a silicon oxide film in between. As shown in FIG. 18, the second transfer gate electrode 32 is connected to a wire that supplies a second transfer pulse P-TRG2. In the second transfer transistor Tr2, the desirable second transfer pulse P-TRG2 is applied to the second transfer gate electrode 32, and thereby, the signal charge accumulated in the second charge accumulation section 25 is read out to the floating diffusion section 34.

The first reset transistor Tr3 includes the floating diffusion section 34, the drain (e.g., reset section) 35, and a first reset gate electrode 33. The floating diffusion section 34 serves as a source. The drain 35 is connected to a power voltage Vdd. The first reset gate electrode 33 configuring the first reset transistor Tr3 may be formed on the front face of the substrate 12 between the source and the drain, for example, with the gate insulating film 28 formed of a silicon oxide film in between. As shown in FIG. 18, the first reset gate electrode 33 is connected to a wire that supplies a first reset pulse P-RST1. In the first reset transistor Tr3, the desirable first reset pulse P-RST1 is applied to the first reset gate electrode 33, and thereby, the electric potential of the floating diffusion section 34 is reset to the power voltage Vdd.

The second reset transistor Tr4 includes the first charge accumulation section 52, the drain (e.g., extraction section) 29, and a second reset gate electrode 30. The first charge accumulation section 52 serves as a source. The drain 29 is connected to the power voltage Vdd. The second reset gate electrode 30 configuring the second reset transistor Tr4 is a vertically-extending gate electrode that is formed from the front face side of the substrate 12 in the depth direction. Further, the second reset gate electrode 30 has a depth that allows the second reset gate electrode 30 to run through the drain 29 and to reach the first charge accumulation section 52. The second reset gate electrode 30 is formed by filling, with an electrode material, a trench formed at a desirable depth from front face side of the substrate 12 with the gate insulating film 28 in between.

As shown in FIG. 18, the second reset gate electrode 30 is connected to a wire that supplies a second reset pulse P-RST2. In the second reset transistor Tr4, the desirable second reset pulse P-RST2 is applied to the second reset gate electrode 30, and thereby, the potential of the first charge accumulation section 52 is reset to the power voltage Vdd. In this case, a channel is formed along the second reset gate electrode 30, and the signal charge is extracted to the drain (e.g., extraction section) 29 along the second reset gate electrode 30.

The amplifier transistor Tr5 includes a drain connected to the power voltage Vdd, a source also serving as a drain of the selection transistor Tr6, and an amplifier gate electrode 45. As shown in FIG. 18, the amplifier gate electrode 45 between the source and drain of the amplifier transistor Tr5 is connected to the floating diffusion section 34. The amplifier transistor Tr5 configures a source follower circuit that uses the power voltage Vdd as a load. A pixel signal in accordance with a variation in the potential of the floating diffusion section 34 is outputted from the amplifier transistor Tr5.

The selection transistor Tr6 includes a drain also serving as the source of the amplifier transistor Tr5, a source connected to the vertical signal line 9, and a selection gate electrode 46. As shown in FIG. 18, the selection gate electrode 46 between the source and drain of the selection transistor Tr6 is connected to a wire that supplies a selection pulse P-SEL. The selection pulse P-SEL is supplied to the selection gate electrode 46 for each pixel, and thereby, the pixel signal amplified by the amplifier transistor Tr5 is outputted to the vertical signal line 9 via the selection transistor Tr6.

In the cross-sectional configuration shown in FIG. 17, for example, the amplifier transistor Tr5 and the selection transistor Tr6 are each shown as a circuit diagram, and the cross-sectional configuration thereof is not illustrated. However, the amplifier transistor Tr5 and the selection transistor Tr6 may be each formed at a position in the depth direction of the substrate 12 where each of the amplifier transistor Tr5 and the selection transistor Tr6 overlaps the first charge accumulation section 52. The source-drain regions that configure the amplifier transistor Tr5 and the selection transistor Tr6 may also have, for example, a configuration similar to that of the source-drain regions configuring the first reset transistor Tr3.

A plurality of wiring layers are laminated with an interlayer insulating film in between on the front face side of the substrate 12, which is not illustrated. The desirable pulse is supplied to each pixel transistor via these wiring layers, and thereby, the signal charge in each pixel 2 is read out.

The photoelectric conversion section 50 is configured of a photoelectric conversion material that is capable of generating signal charge corresponding to the amount of incident light. The photoelectric conversion section 50 is laminated on the back face side of the substrate 12, and is provided in the pixel region as a whole so as to cover a top face of the first charge accumulation section 52 configured of the n-type semiconductor layer. Further, the photoelectric conversion section 50 is configured to also serve as a light shielding film. Specifically, the light incident on the photoelectric conversion section 50 is subjected to photoelectric conversion therein, and does not enter the substrate 12. Further, also in the photoelectric conversion section 50, an insulating layer 51 is formed in the pixel separation section, and thereby, the photoelectric conversion section 50 is partitioned for each pixel.

As a material for configuring such a photoelectric conversion section 50, a compound semiconductor having a p-type chalcopyrite structure may be used. For example, a chalcopyrite-based compound semiconductor configured of copper-gallium-indium-sulfur-based (hereinafter, described as "CuGaInS-based") mixed crystal that are lattice-matched to the n-type substrate 12 may be formed with a thickness of 1000nm. In particular, the lattice-matched photoelectric conversion section 50 having less crystal defect is formed when composition ratios of Cu, In, Ga, and S are 0.25, 0.12, 0.13, and 0.5, respectively, and the variations in each composition ratio is within a range of +/−10% in the compound semiconductor. Alternatively, not only the chalcopyrite-based compound semiconductor configured of CuInGaS-based mixed crystal, but also the chalcopyrite-based compound semiconductor configured of copper-aluminum-gallium-indium-sulfur-selenium (hereinafter, described as "CuAlGaInSSe")-based mixed crystal may be used.

Figure 19:
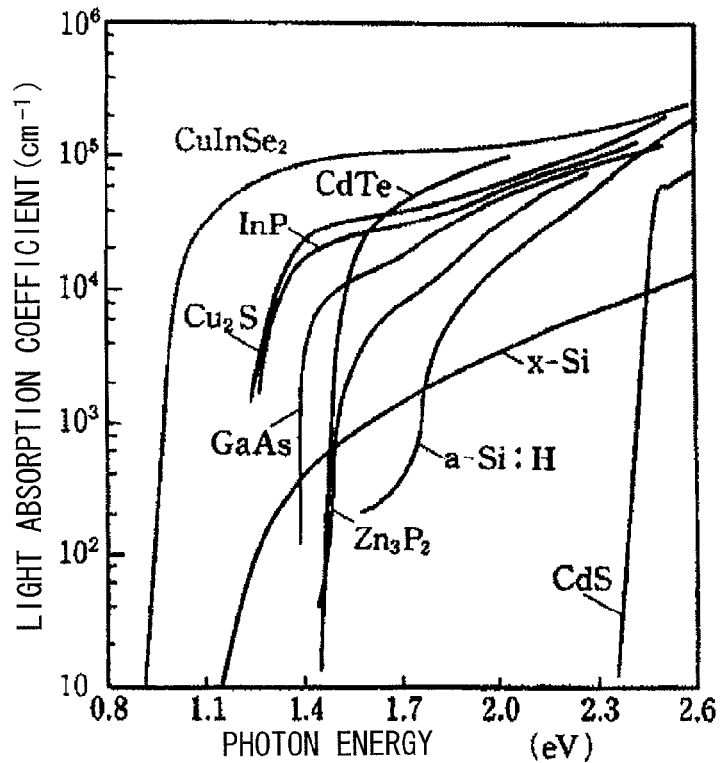
FIG. 19 is an illustrative diagram showing relationships between photon energy and light absorption coefficient in various semiconductor materials, in accordance with various embodiments of the present disclosure.

FIG. 19 shows illustrative relationships between photon energy and light absorption coefficient in various semiconductor materials. As shown in FIG. 19, for example, the light absorption coefficient of CuInSe$_2$ is higher than those of other materials, and in particular, is higher than that of a single crystal of silicon (x-Si, in FIG. 19) by about two digits. Therefore, the photoelectric conversion section formed of CuInSe$_2$ has not only a favorable function as the photoelectric conversion section but also a favorable function of shielding visible light.

The material used for the photoelectric conversion section 50 may have any of a single-crystal structure, a polycrystalline structure, and an amorphous structure as long as the material has absorption coefficient of visible light ray that is higher than that of the substrate 12 formed of silicon and exhibits the photoelectric conversion function. Further, as the chalcopyrite material configuring the photoelectric conversion section 50, chalcopyrite materials other than CuGaInS, CuAlGaInSSe, and CuInSe$_2$ may be used. Other chalcopyrite materials also have high absorption coefficients similar to that of CuInSe$_2$ Therefore, also when other chalcopyrite materials are used, the photoelectric conversion section serves also as the light shielding section. For example, a photoelectric conversion film configured of a chalcopyrite-based compound semiconductor configured of copper-aluminum-silver-gallium-indium-zinc-sulfur-selenium-based (CuAlAgGaInZnSSe-based) mixed crystal, etc. may be used. In this case, in order to reduce crystal defects, the photoelectric conversion section 50 may be desirably lattice-matched to the substrate.

Figure 20:
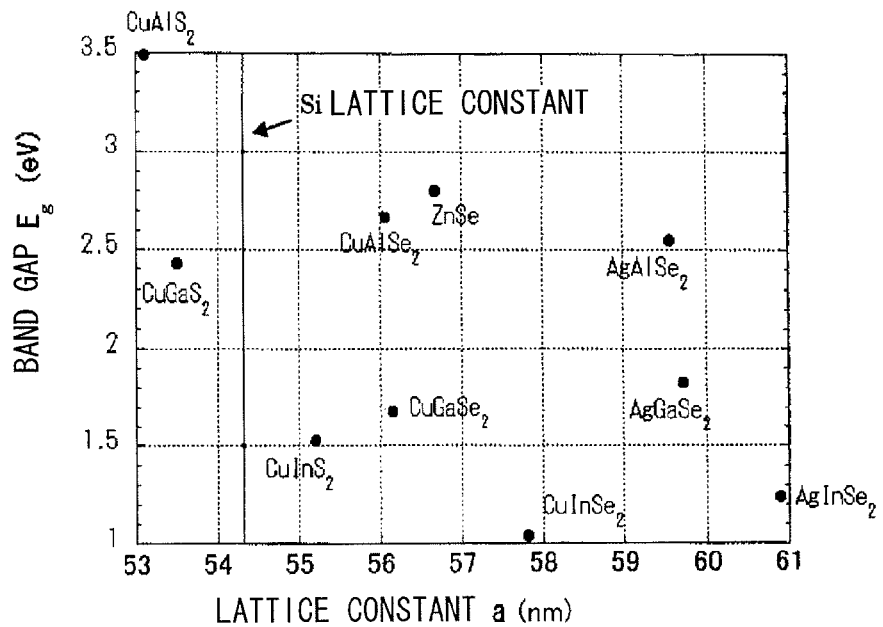
FIG. 20 is an illustrative (first) diagram showing relationships between lattice constant and band gap in respective chalcopyrite materials, in accordance with various embodiments of the present disclosure.
Figure 21:
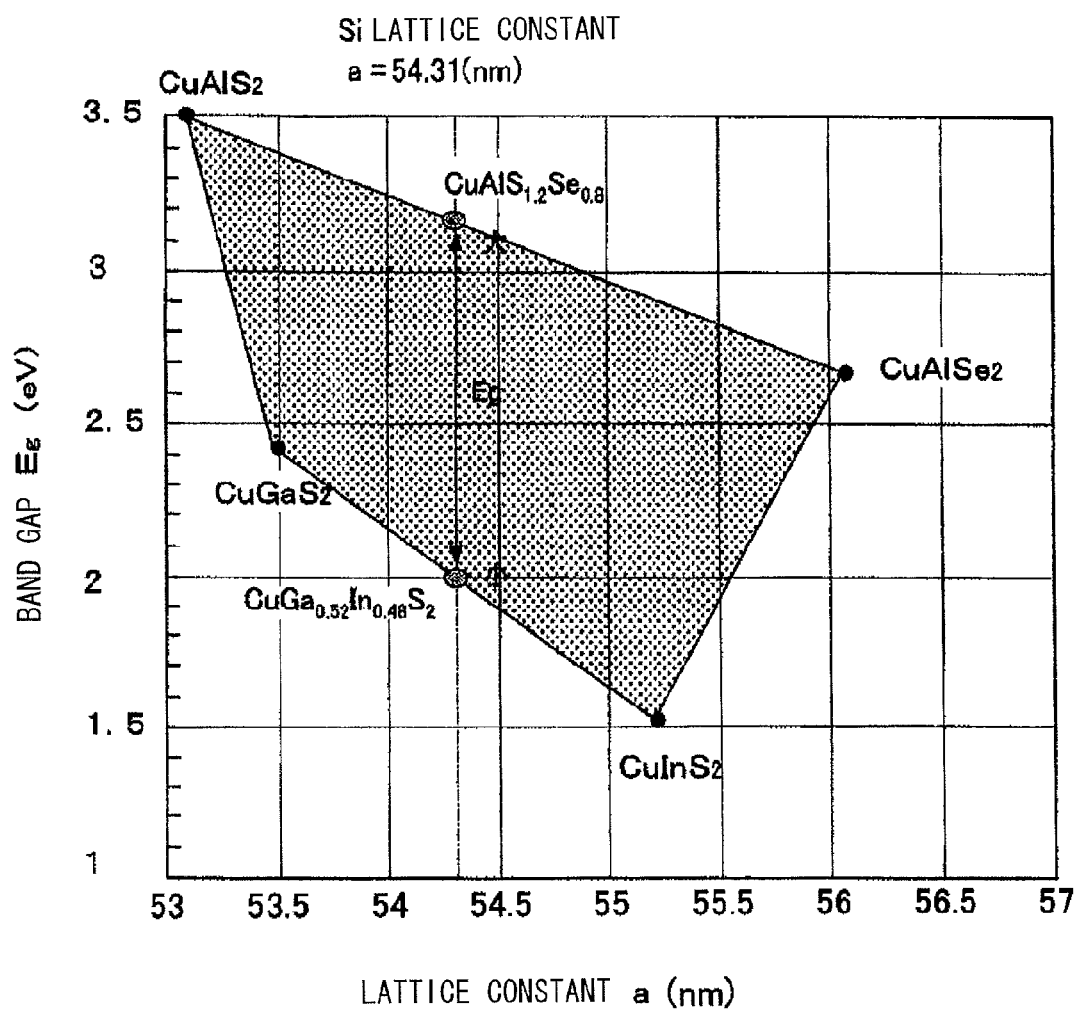
FIG. 21 is an illustrative (second) diagram showing relationships between lattice constant and band gap in respective chalcopyrite materials, in accordance with various embodiments of the present disclosure.

FIGS. 20 and 21 show illustrative relationships between lattice constant and band gap in the chalcopyrite materials. As shown in FIG. 20, there are various kinds of chalcopyrite material. Out of these chalcopyrite materials, as shown in FIG. 21, the composition of the CuAlGaInSSe-based mixed crystal may be controlled to allow the CuAlGaInSSe-based mixed crystal to be hetero-epitaxy in which the lattice constant thereof is lattice-matched to the lattice constant of 5.43angstroms of silicon. Therefore, crystal defects are reduced. Accordingly, the CuAlGaInSSe-based mixed crystal may be epitaxially grown as a single-crystal thin film on the substrate 12 formed of silicon. Therefore, crystal defects such as misfit dislocation caused at the hetero-interface are reduced. Such a crystal defect causes formation of a deep level in the band gap, and the carriers such as electrons and holes that are caught at this level are extracted. Therefore, the carriers become dark current (e.g., noise) being attached to signals. In particular, for example, with the deep level, time constant until the carriers are extracted is long. Therefore, in practice, noise occurs disadvantageously. Accordingly, by reducing crystal defects with the lattice-matched hetero-epitaxy, occurrence of dark current is suppressed or reduced. As a result, noise is reduced.

The chalcopyrite material configuring the photoelectric conversion section 50 has a conductivity type of a p type. In the case where electrons are used as the signal charge, as in the present embodiment, the photoelectric conversion section 50 is configured to allow the electric potential to be higher toward the substrate 12. As a result, the signal charge generated in the photoelectric conversion section 50 moves along the potential gradient, and is accumulated in the first charge accumulation section 52.

The photoelectric conversion section 50 may be formed of organic material other than the above-described inorganic materials. Some organic materials may also have high absorption coefficient, and may be a material to have both functions of light shielding and photoelectric conversion. Examples of such organic materials may include organic materials that include, for example, and are not limited to, quinacridone-based pigments, coumarin-based pigments, and/or the like, and other organic materials that have absorption coefficient higher than that of silicon by two digits. By forming the photoelectric conversion section 50 of the above-described organic materials, the photoelectric conversion section 50 serves as the photoelectric conversion section and also as the light shielding section.

In the present embodiment, the color filter layer 23 is provided on the light incident side of the photoelectric conversion section 50. Therefore, when the photoelectric conversion section 50 is configured of the organic material, a material having sensitivity for all range of visible light may be used. Also, the photoelectric conversion section 50 may be configured to absorb light having wavelength corresponding to wavelength of light that is transmitted by the color filter layer 23 in each pixel.

The organic materials have low mobility of electrons. Therefore, when the photoelectric conversion section 50 is formed of the organic material for example, the insulating layer 51 that separates the photoelectric conversion sections 50 in the respective pixels may not be formed, and the photoelectric conversion section 50 may be formed on the entire surface of the pixel region. Further, in the case where the photoelectric conversion section 50 is formed of the organic material, the photoelectric conversion section 50 is formed by applying the organic material onto the substrate 12.

The electron barrier layer 58 may be formed, for example, of NiO having a thickness from 4nm to 100nm both inclusive on the transparent electrode 57 side of the photoelectric conversion section 50. The electron barrier layer 58 is formed on the photoelectric conversion section 50 and is partitioned for each pixel as with the photoelectric conversion section 50. In various embodiments, the electron barrier layer 58 is the potential barrier that suppresses or reduces inflow of electrons from the transparent electrode 57 to the photoelectric conversion section 50, as described in the above outline of the present embodiment of the present technology.

Figure 22:
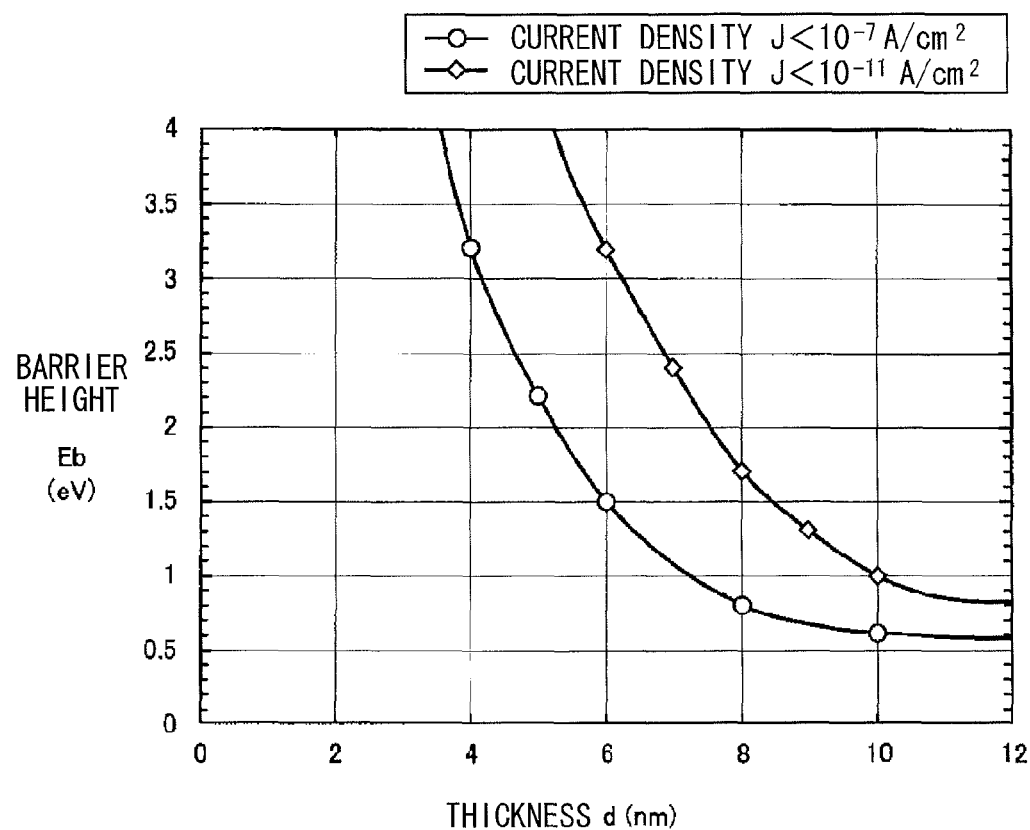
FIG. 22 is an illustrative diagram showing a relationship between thickness (nm) and barrier height (eV) of the electron barrier layer based on the characteristics of current density and voltage, in accordance with various embodiments of the present disclosure.

FIG. 22 shows an illustrative relationship between thickness (nm) and barrier height (eV) of the electron barrier layer 58 in order to have conditions to be the potential barrier that suppresses or reduces the inflow of electrons from the transparent electrode 57 to the photoelectric conversion section 50. The graph shown in FIG. 22 is a simulation of characteristics of current density and voltage (J-V characteristics) that is based on the emission theory of Bethe and that takes into consideration the tunnel effect, for example. FIG. 22 shows an illustrative relationship between the thickness (nm) and the barrier height (eV) of the electron barrier layer 58 for each of a condition that the current density J is smaller than $1*10^{-7} A/cm^2$ and a condition that the current density J is smaller than $1*10^{-11} A/cm^2$.

As illustrated in FIG. 22, the thickness (nm) and the barrier height (eV) of the electron barrier layer 58 is shown as a curved line (where the x axis indicates thickness and the y axis indicates barrier height) that is close to a hyperbolic line of inverse proportion. In FIG. 22, regarding the condition of $J<1*10^{-11} A/cm^2$, an upper-right region of the curved line in the drawing satisfies this condition. Similarly, regarding the condition of $J<1*10^{-7} A/cm^2$, an upper-right region of the curved line in the drawing satisfies this condition. As can be seen from the above-description, it may be necessary to increase the thickness of the electron barrier layer 58 when the barrier is lower, and in reverse, the electron barrier layer 58 may be thin when the barrier is high. This graph shows invariant characteristics independent of kinds of materials such as organic or inorganic.

As can be seen from FIG. 22, the thickness of the electron barrier layer 58 may be 4nm or larger. By allowing the thickness of the electron barrier layer 58 to be 4nm or larger, when a material having barrier height of 3eV or larger is used to configure the electron barrier layer 58, the current density J becomes $1*10^{-7} A/cm^2$ or smaller even under application of a voltage of −2V. Accordingly, a configuration, for an image sensor, that is not saturated by dark current may be provided. In other words, when the electron barrier layer 58 has a thickness of 4nm or larger, the electron barrier layer 58 serves as a barrier against electrons. Therefore, an effect of suppressing injection of electrons from the transparent electrode 57 into the photoelectric conversion section 50 (or reducing injection of electrons from the transparent electrode 57 into the photoelectric conversion section 50) may be obtained.

Moreover, by allowing the thickness of the electron barrier layer 58 to be 6nm or larger, when a material having barrier height of 3eV or larger is used to configure the electron barrier layer 58, the current density J becomes $1*10^{-11} A/cm^2$ or smaller even under application of a voltage of −2V. Therefore, electrons are accumulated as dark current even when shooting is performed at a normal shutter speed of 1/30 second, which provides a sufficient or improved configuration for an image sensor. Consequently, the electron barrier layer 58 may have a thickness of 6nm or larger.

By allowing the electron barrier layer 58 to have a thickness of 6 nm or larger, the current density J is $1*10^{-7} A/cm^2$ or smaller even under application of a voltage of −2V. Therefore, a configuration that is not saturated, or substantially saturated, by dark current is provided for an image sensor.

Further, the electron barrier layer 58 may have a thickness of 9nm or larger. When the electron barrier layer 58 has a thickness of 9nm or larger, even when a material having barrier height of 1.5eV or larger is used, the current density J is $1*10^{-11} A/cm^2$ or smaller under application of a voltage of −2V. Therefore, electrons are accumulated as dark current even when shooting is performed at a normal shutter speed of 1/30 second, which provides a sufficient or improved configuration for an image sensor.

Moreover, as can be seen from FIG. 22 for example, for the electron barrier layer 58, a material in which barrier height against electron from the Fermi level of the transparent electrode 57 is 0.6eV or larger may be used. When the barrier height of the electron barrier layer 58 is 0.6eV or larger, the current density J becomes $1*10^{-7} A/cm^2$ or smaller, even under application of a voltage of −2V. Therefore, a configuration that is not saturated by dark current may be provided for an image sensor.

Moreover, for the electron barrier layer 58, a material in which barrier height against electron from the Fermi level of the transparent electrode 57 is 1.0eV or larger may be used. When the barrier height is 1.0eV or larger, the current density J becomes $1*10^{-11} A/cm^2$ or smaller, even under application of a voltage of −2V. Therefore, electrons are accumulated as dark current even when shooting is performed at a normal shutter speed of 1/30 second, which provides a sufficient or improved configuration for an image sensor.

Moreover, for the electron barrier layer 58, a material that serves as a barrier of 0.5eV or smaller against the holes generated in the photoelectric conversion section 50 may be used. By using the material having barrier height of 0.5eV or smaller, the electron barrier layer 58 does not serve as a barrier against the holes generated in the photoelectric conversion section 50 through light application. Therefore, the holes are extracted to the transparent electrode 57. Moreover, the electron barrier layer 58 may be formed so as to have a thickness of 100nm or smaller. By forming the electron barrier layer 58 to be 100nm or smaller, the slope of the band of the electron barrier layer 58 that is a barrier against holes as shown in FIG. 8 becomes sufficiently small. Therefore, the electron barrier layer 58 does not serve as the barrier against the holes generated in the photoelectric conversion section 50 through light application. Therefore, the holes are extracted to the transparent electrode 57. Further, when the electron barrier layer 58 has a thickness of 100nm or smaller, the electron barrier layer 58 has little influence on a voltage applied from the transparent electrode 57 to the photoelectric conversion section 50.

As a material configuring such an electron barrier layer 58, for example, NiO, $Cu_2O$, or $ZnRh_2O_4$ shown in the above Table 2 may be used. Alternatively, a multilayer structure in which the above-described materials are laminated may be used.

The material for configuring the electron barrier layer 58 is not limited to the above-described inorganic materials, and may be organic materials described as examples below. Examples of the organic material may include, and are not limited to, NBphen (2,9-Bis(naphthalene-2-yl)-4,7-diphenyl-1,10-phenanthroline, molecular formula: $C_{13}H_{15}NO_3$) represented by the following chemical formula 1, BCP (1-[(1,3-Benzodioxol-5-yl)carbonyl]piperidine, molecular formula: $C_{13}H_{15}NO_3$) represented by the following chemical formula 2, and CBP (3-Bromo-1-chloro-1-propene, molecular formula: $C_3H_4BrCl$) represented by the following chemical formula 3.

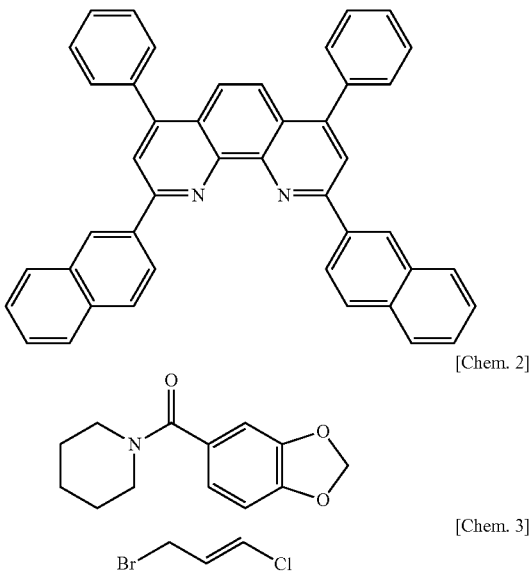

[Chem. 1]

[Chem. 2]

[Chem. 3]

As described herein, the electron barrier layer 58 is formed on the surface on the light incident side of the photoelectric conversion section 50. Therefore, injection of electrons into the photoelectric conversion section 50 when the signal is read out by applying a reverse bias is suppressed or reduced. Accordingly, a leakage current is suppressed or reduced, and therefore, a dark current to be a noise component is suppressed or reduced. Accordingly, image quality of the solid-state image pickup device is improved without decreasing the S/N ratio.

In various embodiments, the transparent electrode 57 is formed on the light incident face side, above the photoelectric conversion section 50. The transparent electrode 57 is partitioned for each pixel, as with the photoelectric conversion section 50. The transparent electrode 57 is formed of a p-type electrode material that transmits light having wavelength in a visible light range. For example, the transparent electrode 57 may be configured of a transparent conductive film such as an indium-tin-oxide (ITO) film, an indium-zinc-oxide film, an aluminum-zinc-oxide (AZO) film, and a zinc-oxide film. The transparent electrode 57 is grounded at a ground potential, and is configured to prevent charge through hole accumulation. With an external electric field caused by the transparent electrode 57, the signal charge generated in the photoelectric conversion section 50 is collected to the first charge accumulation section 52.

As described above, in the present embodiment, the first charge accumulation section 52 configured of an n-type semiconductor layer is formed below the photoelectric conversion section 50, and the transparent 57 grounded at the ground potential is formed above the photoelectron conversion section 50. Therefore, in the photoelectric conversion section 50, the signal charge (e.g., electrons) generated in accordance with the amount of incident light moves toward the first charge accumulation section 52, and the holes generated together with the signal charge move toward the transparent electrode 57.

The insulating layer 51 is formed to cover the lamination structure, including the photoelectric conversion section 50, the electron barrier layer 58, and the transparent electrode 57, that is partitioned for each pixel. Further, the insulating layer 51 is formed on the entire surface in the pixel region. Also, in the partitioned part of the foregoing lamination structure, the insulating layer 51 is formed on the pixel separation section 53 formed in the substrate 12. The insulating layer 51 is formed of a material that transmits light, and may be insulating material, such as SiN, that transmits light and generally applied to a solid-state image pickup device.

The color filter layer 23 is formed above the photoelectric conversion section 50. For example, in the color filter layer 23, filter layers that selectively transmit light of R (red), G (green), or B (blue) may be arranged for the respective pixels. These filter layers may be arranged for the respective pixels, for example, in Bayer arrangement. The color filter layer 23 transmits light having a desirable wavelength, and the transmitted light enters the photoelectric conversion section 50 on the substrate 12. In the present embodiment, each pixel is configured to transmit light of one of R, G, and B. However, this is not limitative. The color filter layer 23 may be configured of an organic material that transmits light of other colors such as cyan, yellow, and magenta. Various choices are possible and are not limited by the present disclosure.

The on-chip lens 24 is formed on or above the color filter 23 for each pixel. The on-chip lens 24 collects the incident light, and the collected light efficiently enters the photoelectric conversion section 50 with the color filter layer 23 in between. In the present embodiment, the on-chip lens 24 is configured to collect the incident light at a central position of the photoelectric conversion section 50.

In the solid-state image pickup device 1 according to the present embodiment, in particular, the second charge accumulation section 25 and the floating diffusion section 34 are formed in peripheral part of the pixel on the front face side of the substrate 12. On the other hand, in the central part of the pixel on the front face side of the substrate 12, the drain (e.g., reset section) 35 of the first reset transistor Tr3 and the drain (e.g., extraction section) 29 of the second reset transistor Tr4 are formed.

Since the on-chip lens 24 collects light to the central part of the pixel, most of the incident light is collected thereto. The source-drain region 29, the reset section 35, and the like are arranged in the central part of the pixel, and the second charge accumulation section (e.g., accumulation section) 25, the floating diffusion section 34, the amplifier transistor Tr5, the selection transistor Tr6, and the like are arranged in the peripheral part thereof. With this configuration, a disadvantageous influence of smear noise that is caused during global shutter operation is reduced. Specifically, when the light enters the second charge accumulation section (e.g., accumulation section) 25, the floating diffusion section 34, and the like, smear noise is caused. However, when the light enters the source-drain region 29, the reset section 35, and the like, the influence of the entered light on smear noise is small.

(Driving Method)

Figure 23:
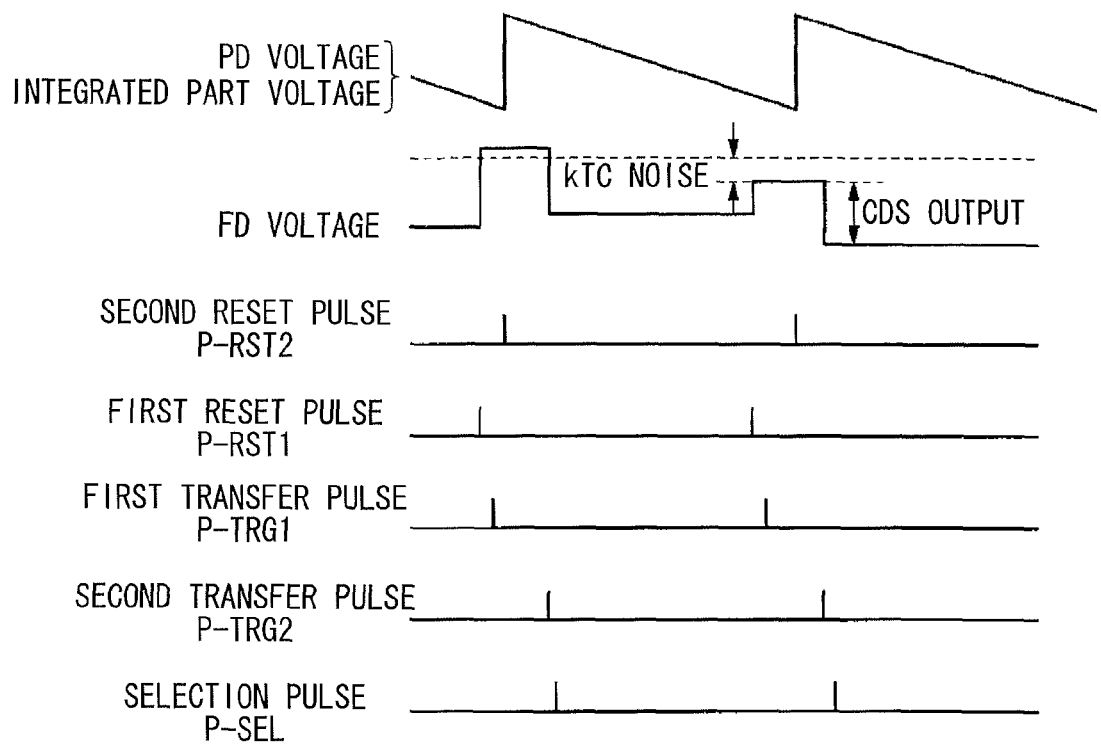
FIG. 23 is an illustrative timing chart showing methods of driving the solid-state image pickup device according to the first embodiment, in accordance with various embodiments of the present disclosure.

Next, description will be given of a method of driving the solid-state image pickup device 1 according to the present embodiment. FIG. 23 shows an illustrative a timing chart of the method of driving the solid-state image pickup device 1 according to the present embodiment. Description will be given below of timing to read the pixels in the n-th row, as an example.

First, for example, supplying of the first reset pulse P-RST1 is started in all of the pixels at the same time to turn on the first reset transistor Tr3. Accordingly, the signal charge accumulated in the floating diffusion section 34 is extracted to the power voltage Vdd side, and thereby, the floating diffusion section 34 is reset. In this example, the signal charge accumulated in the floating diffusion section 34 is the signal charge that has been read in the previous frame. The supplying of the first reset pulse P-RST1 is stopped in all of the pixels at the same time to turn off the first reset transistor Tr3.

Supplying of the first transfer pulse P-TRG1 is started in all of the pixels at the same time to turn on the first transfer transistor Tr1. Thus, the signal charge accumulated in the first accumulation section 52 is transferred to the second charge accumulation section 25. The supplying of the first transfer pulse P-TRG1 is stopped in all of the pixels at the same time to turn off the first transfer transistor Tr1. In the present embodiment, the signal charge read out to the second charge accumulation section 25 in all of the pixels at the same time is held in the second accumulation section 25 until pixels in each row are read.

Supplying of the second reset pulse P-RST2 is started in all of the pixels at the same time to turn on the second reset transistor Tr4. Thus, the signal charge that has been remained in the first charge accumulation section 52, the signal charge that has been accumulated from a time when the first transfer transistor Tr1 is turned off to a time when the second reset transistor Tr4 is turned on, etc. are extracted to the power voltage Vdd side to reset the charge accumulation section 52. The supplying of the second reset pulse P-RST2 is stopped in all of the pixels at the same time to turn off the second reset transistor Tr4, and thereby, exposure in the next frame is started.

A series of operations described above may be performed in all of the pixels at the same time. In the present embodiment, global exposure is started by turning off the second reset transistor Tr4 in all of the pixels at the same time, and the global exposure is completed by turning on the first transfer transistor Tr1 in all of the pixels at the same time. In other words, a period from a timing at which the second reset transistor Tr4 is turned off to a timing at which the first transfer transistor Tr1 is turned on is the exposure period. In the exposure period, the signal charge in accordance with the amount of light incident on the photoelectric conversion section 50 is generated in the photoelectric conversion section 50. The signal charge generated in the photoelectric conversion section 50 moves along the electric potential in the substrate 12, and is accumulated in the first charge accumulation section 52.

Reading is started for each row. When the signal charge in the n-th row is read, when it comes to the turn of operation in the n-th row, supplying of the second transfer pulse P-TRG2 is started to turn on the second transfer transistor Tr2. Thus, the signal charge accumulated in the second charge accumulation section 25 is transferred to the floating diffusion section 34 in the pixels in the n-th row. The supplying of the second transfer pulse P-TRG2 is stopped to turn off the second transfer transistor Tr2.

Supplying of the selection pulse P-SEL is started to turn on the selection transistor Tr6. Thus, output corresponding to the potential of the floating diffusion section 34 is taken into the column signal processing circuit 5 (see FIG. 16) as a pixel signal. The column signal processing circuit 5 performs correlated double sampling by determining a difference between the previously-acquired reset signal and this pixel signal. Accordingly, the column signal processing circuit 5 obtains a pixel signal in which kTc noise is removed. The supplying of the selection pulse P-SEL is stopped to turn off the selection transistor Tr6, and thereby, the reading of the pixels in the n-th row is completed.

After the reading of the pixels in the n-th row is completed, reading of the pixels in the (n+1)th row is performed. Thus, reading of the pixels in all rows is performed sequentially. In such a manner, the solid-state image pickup device 1 according to the present embodiment is driven.

In the solid-state image pickup device 1 according to the present embodiment, the incident light L is subjected to photoelectric conversion in the photoelectric conversion section 50. The generated signal charge (e.g., electron) moves to the first charge accumulation section 52, and is mainly accumulated therein. The holes generated in the photoelectric conversion section 50 moves to the transparent electrode 57.

In the exposure period, the signal charge accumulated in the first charge accumulation section 52 is transferred to the second charge accumulation section 25 by turning on the first transfer transistor Tr1 in all of the pixels at the same time. The signal charge transferred to the second charge accumulation section 25 is accumulated in the second charge accumulation section 25. The signal charge accumulated in the second charge accumulation section 25 is transferred to the floating diffusion section 34 at a timing for each row. At the timing of reading, the pixel signal corresponding to the amount of the signal charge in the floating diffusion section 34 is outputted to the vertical signal line 9 via the selection transistor Tr6. At the time of extracting electrons, the signal charge in the first charge accumulation section 52 is transferred to the drain (e.g., extraction section) 29 of the second reset transistor Tr4 in all of the pixels at the same time by turning on the second reset transistor Tr4.

3. First Embodiment (Method of Manufacturing Solid-State Image Pickup Device)

Next, description will be given of a method of manufacturing the solid-state image pickup device 1 according to the present embodiment. The solid-state image pickup device 1 according to the present embodiment may be manufactured, for example, as follows.

Figure 24A:
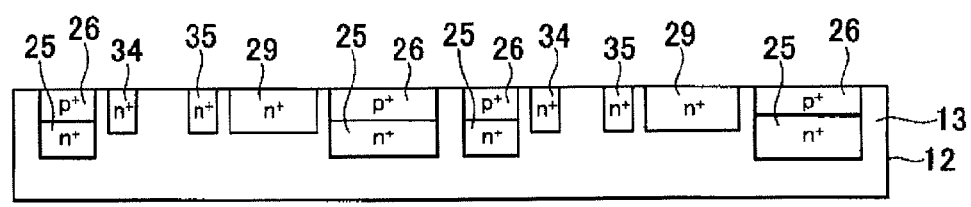
FIG. 24A is an illustrative manufacturing process diagram showing methods of manufacturing the solid-state image pickup device according to the first embodiment, in accordance with various embodiments of the present disclosure.

For example, p-type impurity may be ion-injected into the n-type substrate 12, and thereby, the p-type well region 13 is formed. As illustratively shown in FIG. 24A, a Group V material such as P (phosphorous) that is an n-type dopant is ion-injected to the front face side of the substrate 12, and thereby, the second charge accumulation section 25, the floating diffusion section 34, and the source-drain regions 29 and 35 of each pixel transistor are formed. The p-type impurity is ion-injected to the front face side of the second charge accumulation section 25 at high concentration, and thereby, a thin p-type semiconductor layer 26 is formed. These processes are executed by using typical processes of manufacturing a CMOS-type solid-state image pickup device.

Figure 24B:
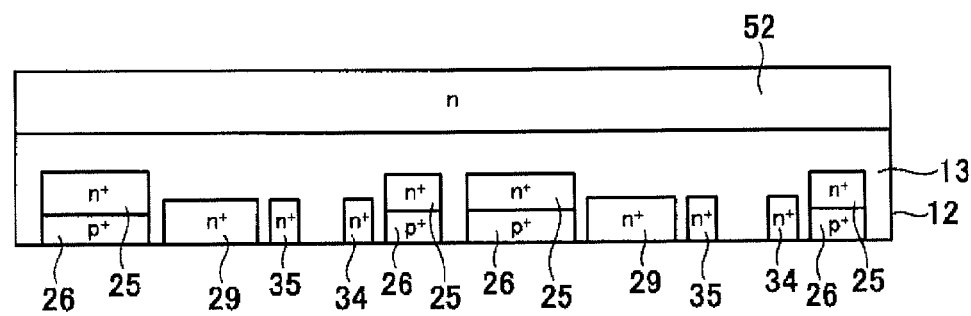
FIG. 24B is an illustrative manufacturing process diagram showing methods of manufacturing the solid-state image pickup device according to the first embodiment, in accordance with various embodiments of the present disclosure.

A supporting substrate (not illustrated) formed of silicon etc. is attached onto the front face side of the substrate 12. The substrate 12 is turned over so that the back face side of the substrate 12 is on the upper side. As shown in FIG. 24B, the back face side of the substrate 12 may be doped with the n-type impurity and the n-type semiconductor layer to be the first charge accumulation section 52 may be epitaxially grown to a desirable thickness, for example, by a CVD method.

Figure 24C:
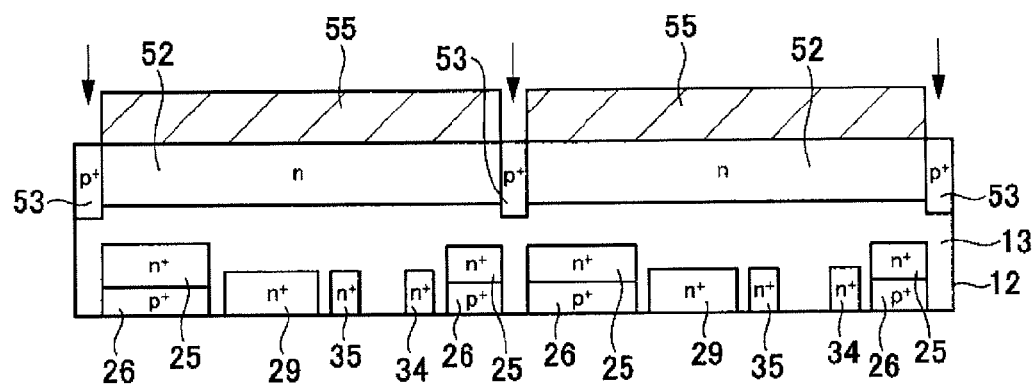
FIG. 24C is an illustrative manufacturing process diagram showing methods of manufacturing the solid-state image pickup device according to the first embodiment, in accordance with various embodiments of the present disclosure.

As shown in FIG. 24C, a resist layer 55 is formed on the n-type semiconductor layer of the first charge accumulation section 52. The resist layer 55 has an aperture in a region in which the pixel separation section 53 is to be formed. The resist layer 55 may be form by typical photolithography. The p-type impurity may be ion-injected with the resist layer 55 in between, for example, so as to achieve concentration higher than that of the impurity configuring the p-type well region 13. Accordingly, the pixel separation section 53 is formed. The p-type semiconductor layer configuring the pixel separation section 53 is formed to have a depth that allows at least the first charge accumulation section 52 is separated for each pixel.

Figure 25D:
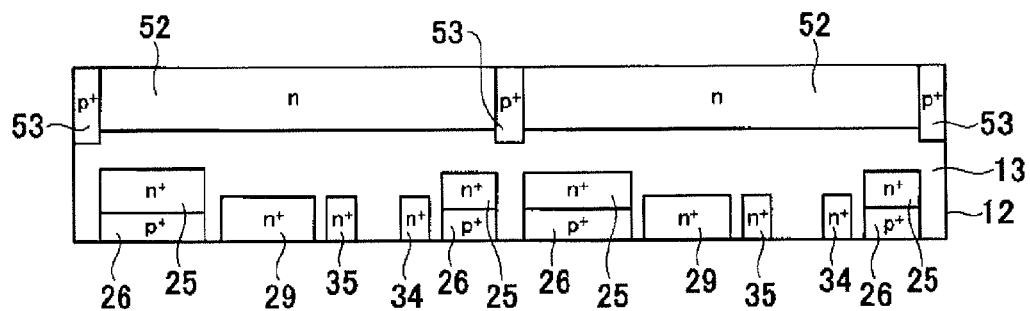
FIG. 25D is an illustrative manufacturing process diagram showing methods of manufacturing the solid-state image pickup device according to the first embodiment, in accordance with various embodiments of the present disclosure.
Figure 25E:
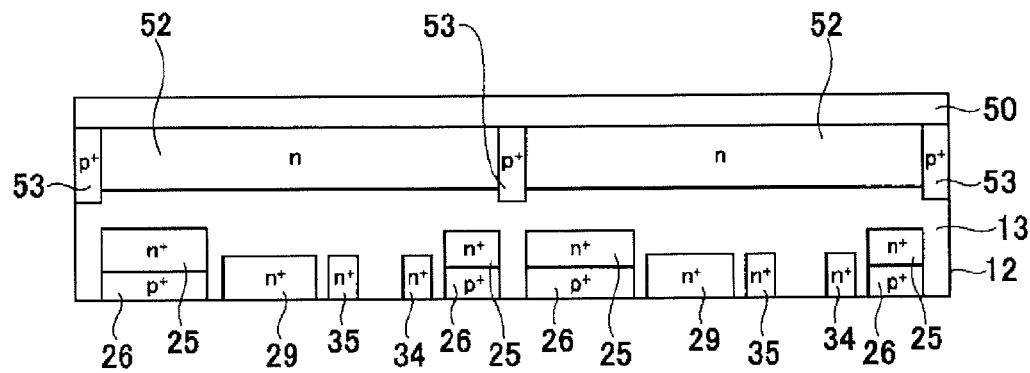
FIG. 25E is an illustrative manufacturing process diagram showing methods of manufacturing the solid-state image pickup device according to the first embodiment, in accordance with various embodiments of the present disclosure.

As shown in FIG. 25D, the resist layer 55 on the first charge accumulation section 52 is removed. As shown in FIG. 25E, for example, the chalcopyrite-based material may be epitaxially grown on the first charge accumulation section 52, and thereby, the photoelectric conversion section 50 is formed. In the present embodiment, a method of the epitaxial growth of the chalcopyrite-based compound semiconductor may be, for example, a molecular beam epitaxy (MBE) method, a metalorganic chemical vapor deposition (MOCVD) method, or a liquid phase epitaxy (LPE) method. Any film forming method may be used as long as the method achieves epitaxial growth, for example.

The lattice constant of silicon configuring the substrate 12 is 51.45nm. The CuAlGaInSSe-based mixed crystal includes a material corresponding to this lattice constant, and is capable of forming the photoelectric conversion section 50 to allow the photoelectric conversion section 50 to be lattice-matched to the substrate 12. Therefore, for example, a CuGaInS film may be epitaxally grown as the photoelectric conversion section 50 on the substrate 12.

Figure 28:
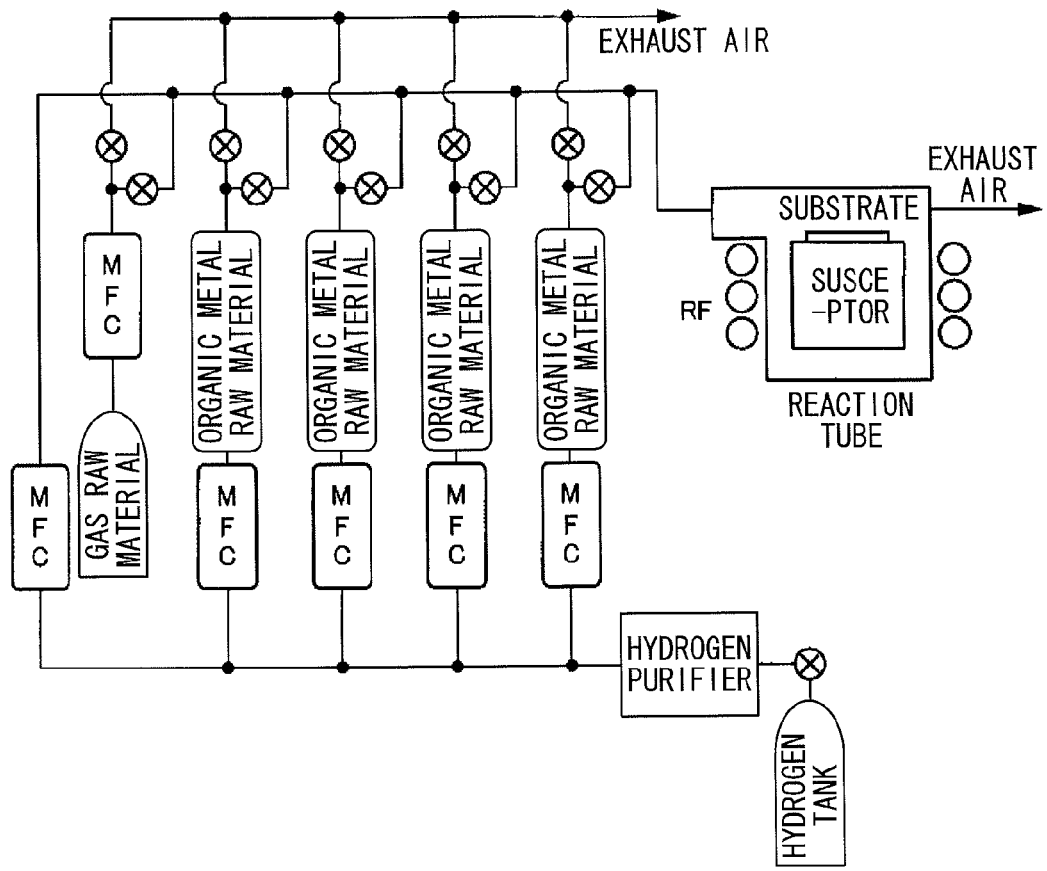
FIG. 28 is an illustrative diagram showing an MOCVD apparatus that is used for forming the photoelectric conversion section, in accordance with various embodiments of the present disclosure.

When the photoelectric conversion section 50 is formed by the MOCVD method, for example, an illustrative MOCVD apparatus as shown in FIG. 28 may be used. When the crystal of the photoelectric conversion section 50 is grown on the substrate 12, the substrate is provided on a susceptor (e.g., made of carbon), as shown in FIG. 28. The susceptor is heated with the use of a high-frequency heater (RF coil), and is provided with a thermocouple and a temperature control mechanism thereof so as to control the temperature of the substrate 12. General temperature of a substrate is in a temperature range from 400degrees C. to 1000degrees C. both inclusive that allows thermal decomposition. However, in order to decrease the temperature of the substrate, for example, light may be applied to the surface of the substrate with the use of a mercury lamp or the like so as to assist the thermal decomposition of the raw material.

By performing bubbling on an organic metal raw material with the use of hydrogen, each raw-material molecule is transferred, in a saturated vapor pressure state, to a reaction tube. In this example, a mass flow controller (MFC) is used to control a flow amount of hydrogen that is flown in each raw material. Accordingly, a molar ratio of the raw material that is transferred per unit time is adjusted. Thus, on the substrate 12 formed of silicon, the organic metal raw material is thermally decomposed and taken into crystal, and thereby, crystal growth occurs. Accordingly, the photoelectric conversion section 50 is formed. The molar ratio of the raw material is correlated to the composition ratio of the crystal to be formed. Therefore, by controlling the molar ratio of the raw material that is transferred per unit time, the composition ratio of the photoelectric conversion section 50 that is epitaxially grown is controllable.

When the photoelectric conversion section 50 is formed by the MOCVD method, as an organic metal raw material of copper, for example, acetylacetone copper ($Cu(C_5H_7O_2)_2$) may be used. Other than this, for example, a cyclopentadienyl-copper-triethyl-phosphate ($h_5$-$(C_2H_5)Cu:P(C_2H_5)_3$) may be used. As an organic metal raw material of gallium (Ga), for example, trimethyl gallium ($Ga(CH_3)_3$) may be used. As an organic metal raw material of aluminum (Al), for example, trimethyl aluminum ($Al(CH_3)_3$) may be used. As an organic metal raw material of indium (In), for example, trimethyl indium ($In(CH_3)_3$) may be used. As an organic metal raw material of selenium (Se), for example, dimethyl selenide ($Se(CH_3)_2$) may be used. As an organic metal raw material of sulfur (S), for example, dimethyl sulfide ($S(CH_3)_2$) may be used. As an organic metal raw material of zinc (Zn), for example, dimethyl zinc ($Zn(CH_3)_2$) may be used.

The raw materials such as cyclopentadienyl-copper-triethyl-phosphate ($h_5$-$(C_2H_5)Cu:P(C_2H_5)_3$), acetylacetone copper ($Cu(C_5H_7O_2)_2$), and trimethyl indium ($In(CH_3)_3$) are in a solid-phase state in room temperature. In such a case, the raw material may be heated so as to be in a liquid-phase state. Alternatively, the raw material may be simply heated to high temperature in a solid-phase state and may be used in a high-vapor-pressure state.

The organic metal raw material is not limited to the above-described raw materials, and any organic metal may be used as a raw material for the MOCVD growth. For example, triethyl gallium ($Ga(C_2H_5)_3$), triethyl aluminum ($Al(C_2H_5)_3$), triethyl indium ($In(C_2H_5)_3$), diethyl selenide ($Se(C_2H_5)_2$), diethyl sulfide ($S(C_2H_5)_2$), or diethyl zinc ($Zn(C_2H_5)_2$) may be used as the raw material. Moreover, the raw material for the MOCVD growth is not limited to organic metal, and may be a gas-based material. For example, hydrogen selenide ($H_2Se$) may be used as the raw material of Se, and hydrogen sulfide ($H_2S$) may be used as the raw material of S.

Figure 29:
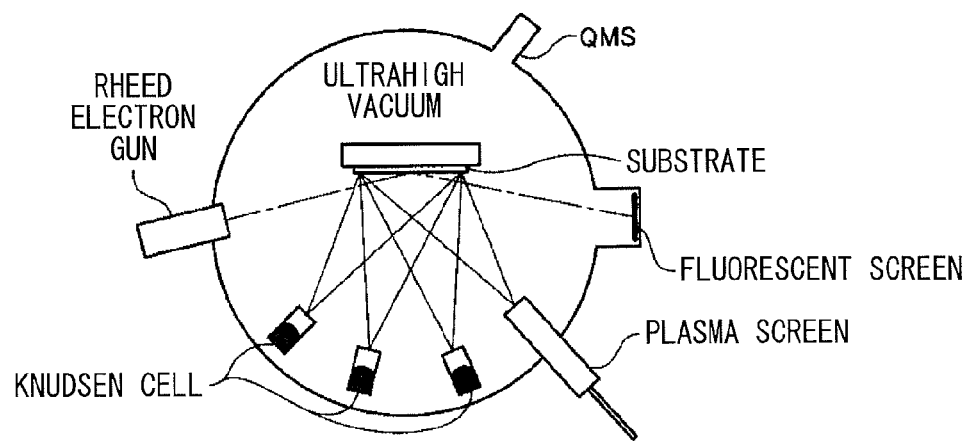
FIG. 29 is an illustrative diagram showing an MBE apparatus that is used for forming the photoelectric conversion section, in accordance with various embodiments of the present disclosure.

When the photoelectric conversion section 50 is formed by the MBE method, for example, an illustrative MBE apparatus shown in FIG. 29 may be used. When the photoelectric conversion section 50 is formed by the MBE method, in the MBE apparatus shown in FIG. 29, each simple-substance raw material for configuring the photoelectric conversion section 50 is put in each Knudsen cell in ultrahigh vacuum, and the raw materials are heated up to appropriate temperature. Thus, molecular beams are generated. By applying the molecular beams onto the substrate 12, a desirable crystal growth layer is formed. The simple-substance raw materials to be put in the Knudsen cells may be gallium (Ga), aluminum (Al), indium (In), selenium (Se), and sulfur (S). In this example, when a raw material having a high vapor pressure such as sulfur (S) is used, stability in an amount of molecular beam may be poor. In this case, a valved cracking cell may be used to stabilize the amount of molecular beam. Further, as in gas-source MBE, part of the raw material may be a gas-source material. In this case, for example, hydrogen selenide ($H_2Se$) may be used as the raw material of Se, and hydrogen sulfide ($H_2S$) may be used as the raw material of sulfur (S).

When the photoelectric conversion section 50 is formed by the MOCVD method or the MBE method, for example, by gradually decreasing the concentration of Zn that is the n-type dopant in accordance with the crystal growth, the photoelectric conversion section 50 in which the band is sloped in a direction that the crystal is grown is formed. By thus allowing the band in the photoelectric conversion section 50 to be sloped, the signal charge generated in the photoelectric conversion section 50 easily moves toward the substrate 12 side. Doping with the n-type dopant is not necessarily performed. For example, the slope of the band may be achievable due to variation in concentration only by controlling the supplying amount of Group III atoms and Group I atoms.

Such a photoelectric conversion section 50 is formed so as to be lattice-matched on the substrate 12. In this case, misfit dislocation caused at the hetero-interface is reduced. Therefore, crystalline characteristics of the photoelectric conversion section 50 become favorable. Therefore, the crystal defect is reduced, and thereby, occurrence of dark current is suppressed or reduced. Accordingly, degradation in image quality due to white spots is prevented. Further, higher sensitivity is achieved. Therefore, shooting with high image quality is achieved even in a dark shooting environment (for example, at night).

Lattice mismatch is expressed by |Da/a| (e.g., Da is a difference between the lattice constant of the photoelectric conversion section and a lattice constant of the substrate, and a is the lattice constant of the substrate). When lattice match is achieved, Da/a=0is established, for example. In the present embodiment, "lattice match" encompasses a state that is close to the state of lattice match under a condition that the thickness of the photoelectric conversion section 50 formed by crystal growth is within the critical film thickness. In other words, if the thickness of the photoelectric conversion section 50 is within the critical film thickness, a state in which the crystalline characteristics thereof is favorable and misfit dislocation does not occur is achievable even if the lattice match is not completely achieved. "Critical film thickness" is defined in "Matthew-Blakeslee criterion" (J. W. Matthews and A. E. Blakeslee, J. Cryst. Growth 27(1974) 118-125) or in "People-Bean criterion" (R. People and J. C. Bean, Appl. Phys. Lett. 47(1985) 322-324).

Figure 25F:
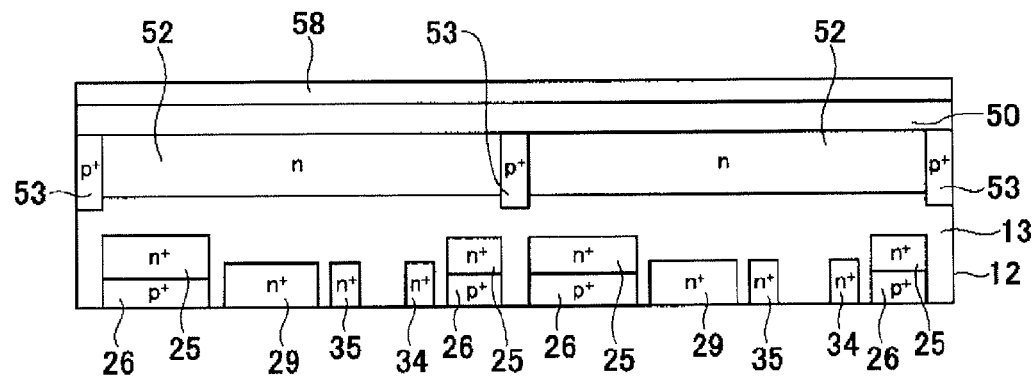
FIG. 25F is an illustrative manufacturing process diagram showing methods of manufacturing the solid-state image pickup device according to the first embodiment, in accordance with various embodiments of the present disclosure.

After forming the photoelectric conversion section 50 configured of epitaxial crystal as described above, as shown in FIG. 25F, the electron barrier layer 58 is formed on the photoelectric conversion section 50. The electron barrier layer 58 is formed of each material described above.

Figure 26G:
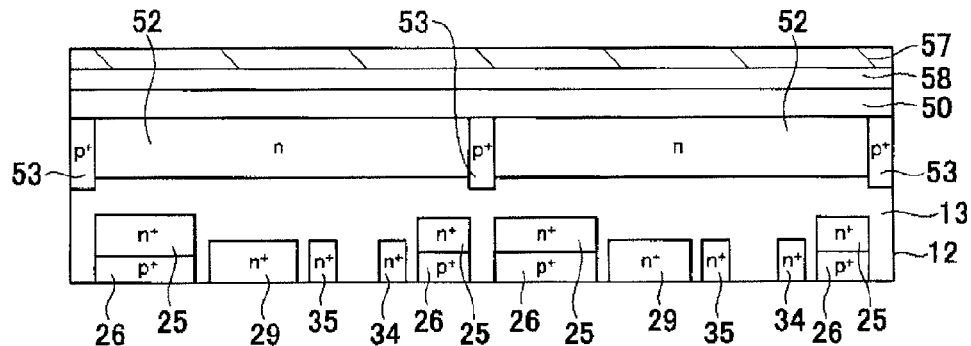
FIG. 26G is an illustrative manufacturing process diagram showing methods of manufacturing the solid-state image pickup device according to the first embodiment, in accordance with various embodiments of the present disclosure.
Figure 26H:
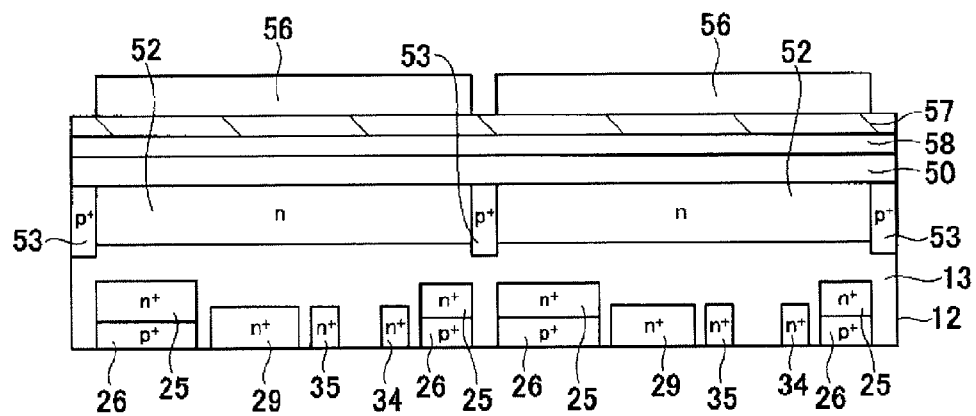
FIG. 26H is an illustrative manufacturing process diagram showing methods of manufacturing the solid-state image pickup device according to the first embodiment, in accordance with various embodiments of the present disclosure.
Figure 26I:
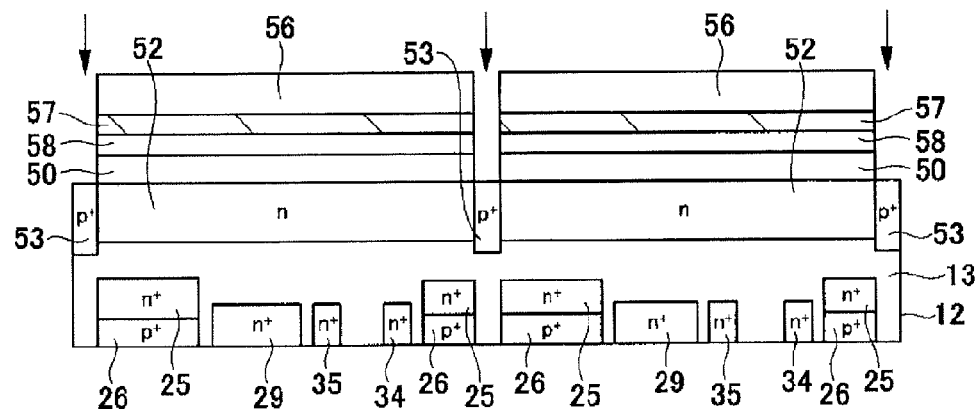
FIG. 26I is an illustrative manufacturing process diagram showing methods of manufacturing the solid-state image pickup device according to the first embodiment, in accordance with various embodiments of the present disclosure.

As shown as an illustrative example in FIG. 26G, the transparent electrode 57 is formed on the electron barrier layer 58. As shown as an illustrative example in FIG. 26H, the resist layer 56 is formed on the transparent electrode 57. The resist layer 56 includes an opening in a region in which the insulating layer 51 is formed. Etching processing by RIE (Reactive Ion Etching) is performed on the transparent electrode 57, the electron barrier layer 58, and the photoelectric conversion section 50 that are exposed from the opening in the resist layer 56. This process allows the transparent electrode 57, the electron barrier layer 58, and the photoelectric conversion section 50 to be separated for each pixel, as shown as an illustrative example in FIG. 26I.

Figure 27J:
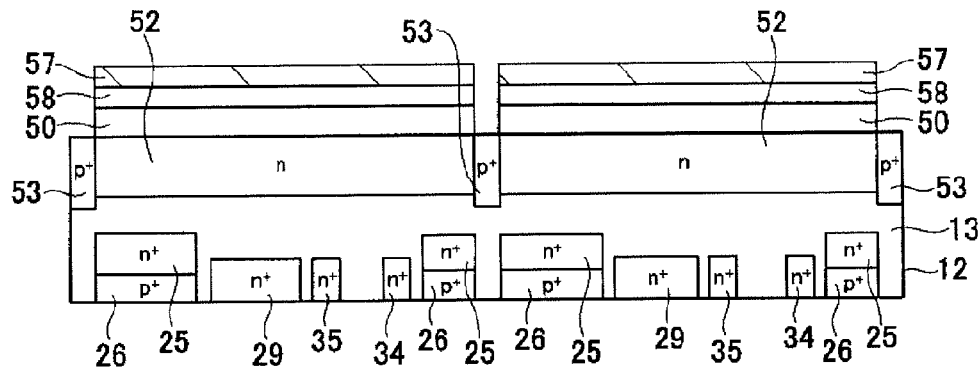
FIG. 27J is an illustrative manufacturing process diagram showing methods of manufacturing the solid-state image pickup device according to the first embodiment, in accordance with various embodiments of the present disclosure.
Figure 27K:
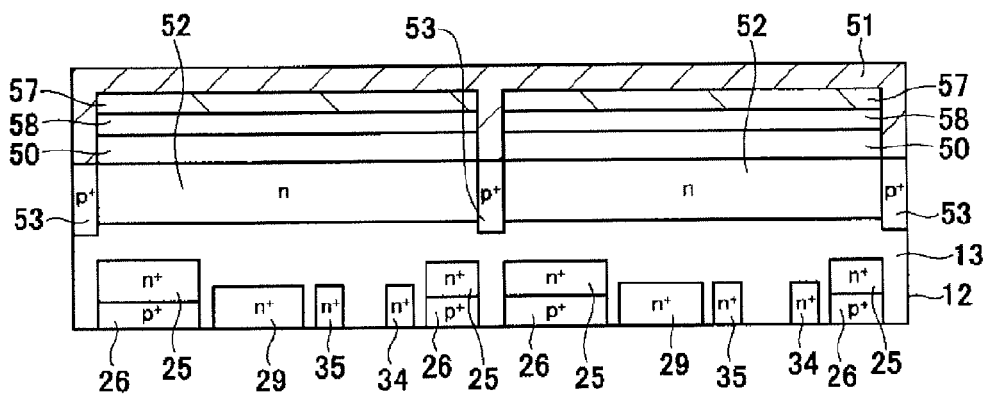
FIG. 27K is an illustrative manufacturing process diagram showing methods of manufacturing the solid-state image pickup device according to the first embodiment, in accordance with various embodiments of the present disclosure.

As shown as an illustrative example in FIG. 27J, the resist layer 56 on the photoelectric conversion section 50 is removed. As shown as an illustrative example in FIG. 27K, an insulating layer is vapor-deposited so as to cover the transparent electrode 57, the electron barrier layer 58, and the photoelectric conversion section 50 that are separated for each pixel. The surface of the insulating layer is planarized by CVD, and thereby, the insulating layer 51 is formed.

Figure 27L:
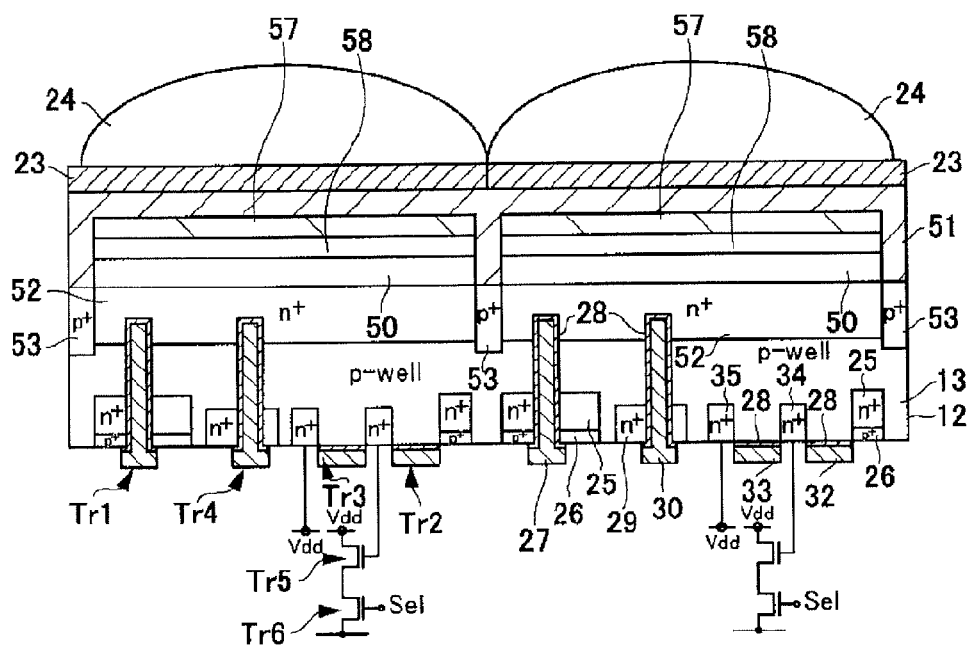
FIG. 27L is an illustrative manufacturing process diagram showing methods of manufacturing the solid-state image pickup device according to the first embodiment, in accordance with various embodiments of the present disclosure.

Each pixel transistor is formed on the front face side of the substrate 12, and the color filter layer 23 and the on-chip lens 24 are formed on the insulating layer 51 on the back face side of the substrate 12, as shown as an illustrative example in FIG. 27L. In such a manner, the solid-state image pickup device according to the present embodiment is manufactured.

(Epitaxial Growth: Off Substrate)

In the present embodiment, for example, the case in which a silicon substrate that has a main surface of a (100) surface is used and the photoelectric conversion section is formed by epitaxially growing the compound semiconductor on the main surface. In other words, the case of using a {100} substrate has been described in the present embodiment. However, the present technology is not limited thereto. When the above-described compound semiconductor is epitaxially grown as a material of an ionic element on non-ionic and non-polar silicon substrate, a defect called anti-phase domain may be caused in some cases. Specifically, cations and anions are grown in opposite phase from each other locally, and thereby, the anti-phase domain occurs. Therefore, an off substrate may be used as the silicon substrate. By allowing the compound semiconductor to be epitaxially grown on the off substrate, occurrence of the anti-phase domain is suppressed or reduced. For example, by using an off substrate in which a surface direction of the {100} substrate of silicon is inclined toward a<011> direction, a region in which the anti-phase domain has occurred is self-vanished as the crystal is grown. Therefore, crystalline characteristics are improved. Examples of the off substrate may include a substrate having an inclination angle from 1degree to 10degrees both inclusive.

Figure 30:
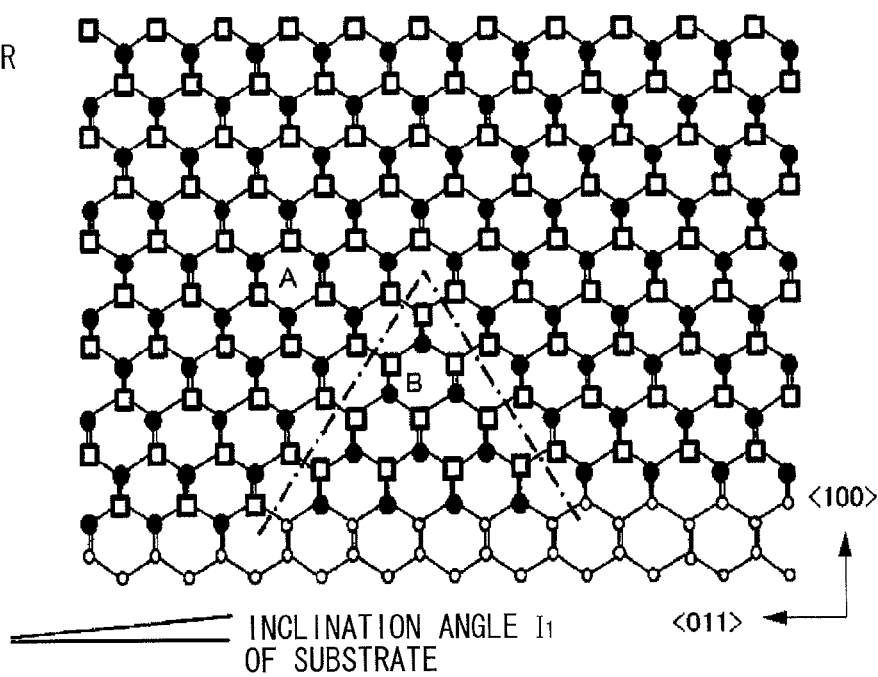
FIG. 30 is an illustrative diagram showing an atom arrangement in a case where the photoelectric conversion section is formed on an off substrate, in accordance with various embodiments of the present disclosure.

FIG. 30 shows an illustrative atom arrangement in a case where the photoelectric conversion section is formed on the silicon substrate that is the off substrate. In FIG. 30, for example, the Group I atom may be copper (Cu) atom, the Group III atom may be gallium (Ga) atom or Indium (In) atom, and the Group VI atom may be sulfur (S) atom, selenium (Se) atom, or the like. In FIG. 30, "atom arrangement of Group I or Group III atom" represented by white squares, indicates that the Group I atoms and Group III atoms are alternately arranged in a direction perpendicular to the paper surface. FIG. 30 illustrates a case in which the growth is started from the Group VI atom on the silicon substrate, and also illustrates a case in which anti-phase domain between cation (e.g, plus-ionic atom) of Group I or III atom and anion (e.g, minus-ionic atom) of Group VI is suppressed or reduced.

As shown in FIG. 30, for example, an off substrate obtained by allowing the {100} substrate to be inclined at an inclination angle (off angle) of $I_1$ in the <011> direction may be used as the silicon substrate. On the silicon substrate that is the off substrate, cations (e.g., plus-ionic atom) of Group I or III atoms and anions (e.g., minus-ionic atom) of Group VI atoms are regularly arranged to form a film of the photoelectric conversion section 50. In this case, the cations and the anions may locally be grown in opposite phases from each other to cause the anti-phase domain in some cases as shown as a region B (e.g., a region partitioned by a dashed-dotted line). However, as shown in FIG. 30, crystal is grown on the surface of the off substrate. Therefore, the region B in which the anti-phase domain has occurred is confined in a triangular shape. Further, epitaxial growth proceeds so as to form only a region A in which the anti-phase domain is not caused, above the region B. In such a manner, occurrence of the anti-phase domain is suppressed or reduced. FIG. 30 illustrates a case in which the inclination angle (e.g., off angle) $I_1$ is 6 degrees. However, as long as an off substrate that has an inclination angle in the above-described range from 1degree to 10degrees both inclusive is used, the effect is obtainable.

(Effects)

According to the configuration of the solid-state image pickup device 1 of the present embodiment described above, the electron barrier layer 58 is provided between the photoelectric conversion section 50 and the transparent electrode 57. Therefore, even when a reverse bias is applied to the photoelectric conversion section 50, a leakage current caused by electron is suppressed or reduced by the electron barrier layer 58. Further, the electron barrier layer 58 is configured not to serve as a barrier against holes that moves from the photoelectric conversion section 50 toward the transparent electrode 57. Therefore, a configuration in which the photoelectric conversion section 50 is not charged is achieved. Accordingly, a phenomenon that electrons are injected from the transparent electrode 57 to the photoelectric conversion section 50 side upon application of a voltage in reverse bias is suppressed or reduced. Therefore, occurrence of a dark current resulting from electron injection from the transparent electrode 57 is suppressed or reduced. Therefore, increase in noise component and decrease in S/N ratio are suppressed or reduced. As a result, degradation in image quality of the solid-state image pickup device is suppressed or reduced.

Moreover, in the present embodiment, the photoelectric conversion section 50 that is formed over the entire surface of the pixel region 3 is configured to also serve as the light shielding section. Therefore, the incident light is prevented from reaching the substrate 12. Accordingly, occurrence of noise is suppressed or reduced.

Moreover, according to the configuration of the solid-state image pickup device 1 of the present embodiment, the first charge accumulation section 52 and the second charge accumulation section 25 are provided. Therefore, the signal charge accumulated in the first charge accumulation section 52 is transferred to the second charge accumulation section 25 in all of the pixels at the same time to allow the transferred signal charge to be once held in the second charge accumulation section 25, and the held signal charge is transferred to the floating diffusion section 34 for each row to be read out to the vertical signal line 9. Accordingly, in the solid-state image pickup device 1 in which the pixels are further miniaturized, global shutter operation is performed. Therefore, exposure of all of the pixels at the same time is achieved. Accordingly, focal plane distortion is solved. Moreover, the exposure of all of the pixels at the same time is performed even when the light shielding film is not provided. Therefore, the opening is enlarged to improve sensitivity and saturated charge amount, compared to a case provided with the light shielding film.

Moreover, in the present embodiment, the second reset transistor Tr4 is separately provided that resets the signal charge accumulated in the first charge accumulation section 52. Therefore, an exposure period for the subsequent frame can be started before the reading period ends. Such an effect may be particularly effective during shooting of a moving image.

Moreover, according to the configuration of the solid-state image pickup device 1 of the present embodiment, the second charge accumulation section 25 and the floating diffusion section 34 are provided in a peripheral part of the pixel. Therefore, the second charge accumulation section (e.g., accumulation section) 25, the floating diffusion section 34, and the like are separated from the central part of the pixel that is a region where light is concentrated by the on-ship lens 24. Therefore, smear noise that is caused by incidence of light is reduced, and thereby, high S/N ratio is obtained. Further, the source-drain region 29, the reset section 35, and the like are formed in the central part of the pixel that is the light concentrated region. Therefore, electric charge causing the smear noise is extracted. Also in this manner, smear noise is reduced. Accordingly, the solid-state image pickup device 1 that has the global shutter function, has small dark current, and has small kTC noise is achieved.

Moreover, according to the configuration of the solid-state image pickup device 1 of the present embodiment, the pixels are allowed to be miniaturized and high resolution is achieved, compared to the CMOS image sensors in prior arts that have the global shutter function. Further, noise that is additionally caused by leakage, into the accumulation section, of diffracted light, scattered light, etc. generated upon reading signals. Also, the solid-state image pickup device 1 is of a back face illumination type. Therefore, sensitivity, saturated sensitivity, etc. are high, which achieves shooting with improved and/or high image quality.

According to the present embodiment, the solid-state image pickup device 1 that has high sensitivity and high saturated charge amount and is capable of providing an image that has favorable image quality at high resolution is achievable.

4. First Modification of First Embodiment

In the first embodiment, the lamination structure including the photoelectric conversion section 50, the electron barrier layer 58, and the transparent electrode 57 is configured to be partitioned for each pixel, as shown in FIG. 17. Alternatively, the lamination structure including the photoelectric conversion section 50, the electron barrier layer 58, and the transparent electrode 57 may not be partitioned for each pixel and may be formed on the entire surface of the pixel region. Description will be given below of a configuration in which the lamination structure including the photoelectric conversion section 50, the electron barrier layer 58, and the transparent electrode 57 is formed on the entire surface of the pixel region as a first modification.

Figure 31:
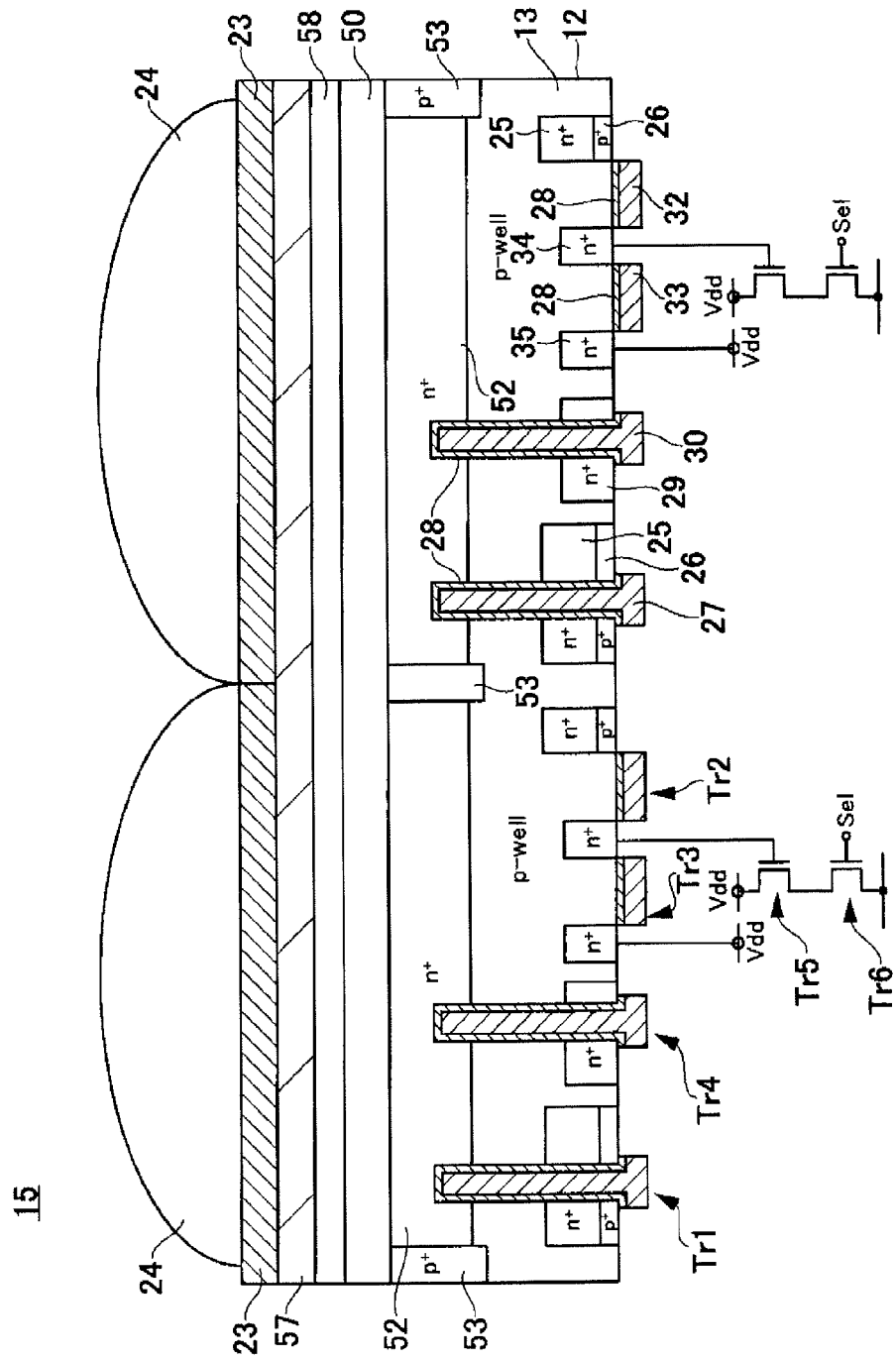
FIG. 31 is an illustrative schematic diagram showing a cross-sectional view of main part of a solid-state image pickup device according to a first modification of the first embodiment, in accordance with various embodiments of the present disclosure.

FIG. 31 is an illustrative schematic configuration diagram (e.g., a cross-sectional view of main part) of a solid-state image pickup device 15 according to the first modification of the first embodiment. In FIG. 31, components corresponding to those in FIG. 17 are designated with the same numerals, and will not be further described.

As shown in FIG. 31, for example, in the solid-state image pickup device 15 according to the first modification, the photoelectric conversion section 50 is continuously formed over adjacent pixels so as to be formed over the entire surface of the pixel region. Further, the electron barrier layer 58 and the transparent electrode 57 that are formed on the photoelectric conversion section 50 are also formed over the entire surface of the pixel region. Moreover, the insulating layer 51 that covers the lamination structure including the photoelectric conversion section 50, the electron barrier layer 58, and the transparent electrode 57 and that separates them for the respective pixels in FIG. 17 is not provided.

Also, in the case in which the photoelectric conversion section 50 is not separated for the respective pixels in such a manner, the photoelectric conversion section 50 is configured of a p-type compound semiconductor having the chalcopyrite material described above. In this illustrative example, the n-type semiconductor layer (the first charge accumulation section 52) and the p-type semiconductor layer (p-type pixel separation section 53) are alternately formed in a lateral direction in the surface of the substrate 12. Also, the respective pixels are separated from one another in the substrate 12. Accordingly, an energy barrier is formed. Therefore, an energy barrier is also generated in the CuInGaS photoelectric conversion section thereabove.

Other configurations are similar to that of the solid-state image pickup device 1 according to the first embodiment shown in FIG. 17, and therefore, will not be described further.

Figure 32A:
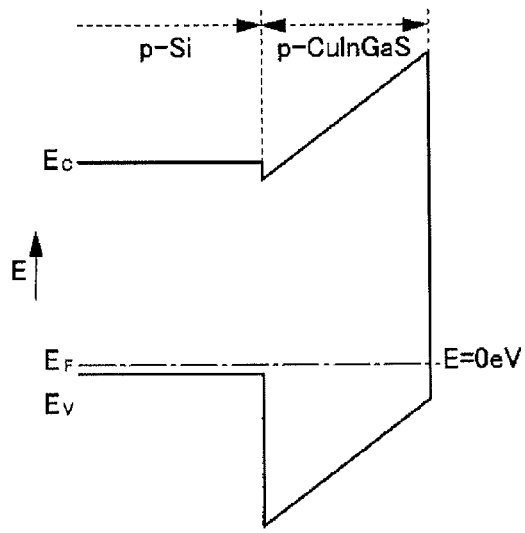
FIG. 32A is an illustrative diagram showing a cross-sectional band structure in a vertical direction of the substrate and the photoelectric conversion section shown in FIG. 31, in accordance with various embodiments of the present disclosure.
Figure 32B:
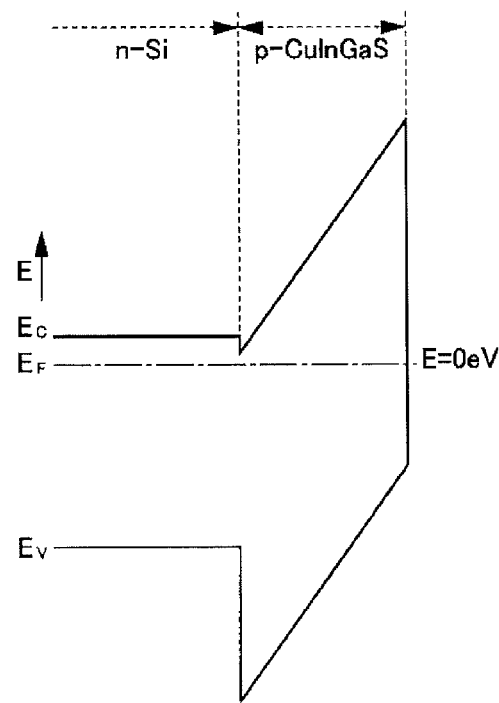
FIG. 32B is an illustrative diagram showing a cross-sectional band structure in a vertical direction of the substrate and the photoelectric conversion section shown in FIG. 31, in accordance with various embodiments of the present disclosure.

Description will be given below of a cross-sectional band structure in a vertical direction and in a horizontal direction concerning the above-described energy barrier. FIGS. 32A and 32B each show an illustrative cross-sectional band structure in the vertical direction of the substrate 12 and the photoelectric conversion section 50 shown in FIG. 31. FIG. 32A illustrates the cross-sectional band structure of a part (end part of the pixel) of the p-type pixel separation section 53. FIG. 32B illustrates the cross-sectional band structure of a part (central part of the pixel) of the first charge accumulation section 52. Further, FIG. 33 illustrates the cross-sectional band structure in the horizontal direction of the photoelectric conversion section 50 shown in FIG. 31.

As shown in FIG. 32A, at the end part of the pixel, CuInGaS is in contact with the p-type silicon, and Fermi level EF is around an upper edge EV of valence band of the silicon. Therefore, a large curve of band is also not caused in CuInGaS. Therefore, a lower edge EC of conduction band is present on the high-energy side compared to the Fermi level EF (is present in a region closer to vacuum level). On the other hand, as shown in FIG. 32B, at the central part of the pixel, CuInGaS is in contact with the n-type silicon, and the Fermi level EF is around the lower edge EC of the conduction band of the silicon. Therefore, a large curve of band is caused in CuInGaS, and the lower edge EC of the conduction band of CuInGaS is present at a position (in a region on the low-energy side) close to the Fermi level EF (is present at a position far from the vacuum level). In this example, the energy of the Fermi level EF is 0eV.

Figure 33:
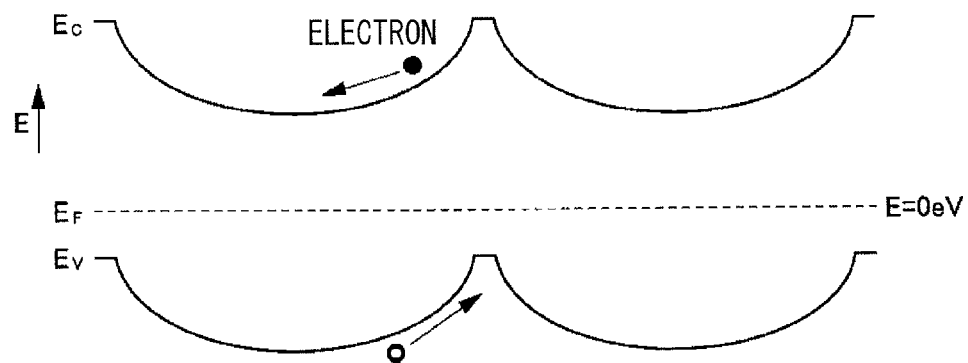
FIG. 33 is an illustrative diagram showing a cross-sectional band structure in a horizontal direction of the photoelectric conversion section shown in FIG. 31, in accordance with various embodiments of the present disclosure.

Accordingly, the cross-sectional band structure in the horizontal direction as shown in FIG. 33 is provided in the CuInGaS film. In this case, the end part of the pixel serves as an energy barrier against the electron generated by photoelectric conversion. Therefore, the electrons are collected in the central part of the pixel. On the other hand, the central part of the pixel serves as an energy barrier against holes generated by the photoelectric conversion. Therefore, the holes are collected in the edge part of the pixel. Accordingly, by applying a voltage in revere bias from the transparent electrode 57 to the photoelectric conversion section 50, the electrons are transferred toward the n-type silicon side and the holes are transferred to the transparent electrode 57.

According to the configuration of the solid-state image pickup device 15 of the first modification, the pixel separation section in the photoelectric conversion section 50 may not be necessary. Therefore, the manufacturing process is simplified, e.g., the number of steps, manufacturing cost, etc. may be reduced.

5. Second Modification of First Embodiment

Description will be given of a configuration in which the first charge accumulation section 52 is connected to the photoelectric conversion section 50 via an electrode plug 65. This allows the signal charge generated in the photoelectric conversion section 50 to be transferred from the photoelectric conversion section 50 side to the substrate 12 side in the case where the photoelectric conversion section 50 is formed on the substrate 12 as in the first embodiment.

Figure 34:
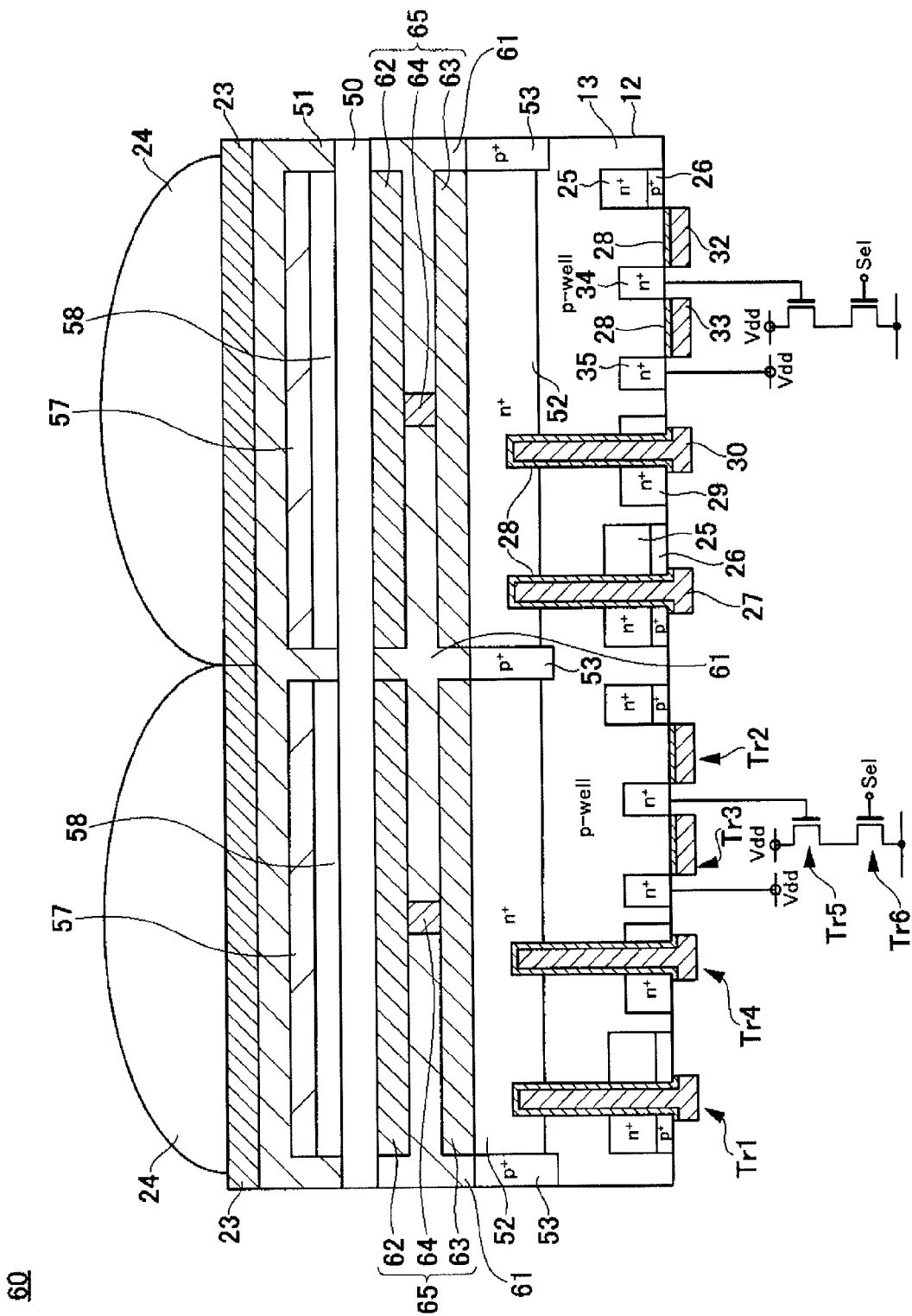
FIG. 34 is an illustrative schematic diagram showing a cross-sectional view of main part of the solid-state image pickup device according to a second modification of the first embodiment, in accordance with various embodiments of the present disclosure.

FIG. 34 is an illustrative schematic configuration diagram (a cross-sectional view of main part) of a solid-state image pickup device 60 according to a second modification of the first embodiment. In FIG. 34, components corresponding to those in FIG. 17 are designated with the same numerals, and will not be further described.

In the solid-state image pickup device 60 shown in FIG. 34, for example, the photoelectric conversion section 50 is continuously formed over the adjacent pixels. Further, the electrode plug 65 is provided between the substrate 12 and the photoelectric conversion section 50. The electrode plug 65 is partitioned for the respective pixels.

The electrode plug 65 includes a first lower electrode 62, a second lower electrode 63, and a via 64 that connects the first lower electrode 62 to the second lower electrode 63. The second lower electrode 63 is formed on the substrate 12 and is so formed as to cover almost the entire surface of the first charge accumulation section 52. The first lower electrode 62 is formed on the second lower electrode 63 with an insulating layer 61 in between. The photoelectric conversion section 50 is formed on the first lower electrode 62. The first lower electrode 62 is in contact with almost the entire surface of the photoelectric conversion section 50 in the pixel section. The first lower electrode 62 is connected to the second lower electrode 63 by the via 64 that runs through the insulating layer 61.

The electrode plug 65 may be formed, for example, of a material such as Al, Cu, and AlCu. Further, an n-type semiconductor layer may be provided between the electrode plug 65 and the photoelectric conversion section 50, which is not illustrated. For example, as the n-type semiconductor layer, a layer such as an Al:ZnO layer and a TiO2 layer may be formed. The electrode plug 65 and the n-type semiconductor layer may be formed, for example, by sputtering, laser aberration, and/or the like with the use of the above-described materials.

Other configurations are similar to that of the solid-state image pickup device 1 according to the first embodiment shown in FIG. 17, and therefore, will not be described further. In the solid-state image pickup device 60 having such a configuration, the photoelectric charge subjected to photoelectric conversion in the photoelectric conversion section 50 is transferred by an electric field toward the substrate 12 via the electrode plug 65, is stopped at the potential barrier, and is accumulated in the first charge accumulation section 52.

In the configuration shown in FIG. 34, the first lower electrode 62 is connected to almost the entire surface of the photoelectric conversion section 50 in the pixel region. However, it is enough that the photoelectric conversion section 50 be partially connected to the first lower electrode 62. Further, in the configuration shown in FIG. 34, the second lower electrode 63 is so formed to cover almost the entire surface above the first charge accumulation section 52. However, it is enough that, at least, part of the second lower electrode 63 be connected to the first charge accumulation section 52.

According to the configuration of the solid-state image pickup device 60 according to the second modification, the electrode plug 65 is used as the lower electrode of the photoelectric conversion section 50. Therefore, a higher voltage is applied to the photoelectric conversion section 50. Therefore, reading of signal of the photoelectric conversion section 50 is performed at a rate of nearly 100%. Therefore, avalanche amplification is produced to configure an image sensor having high sensitivity.

6. Second Embodiment (Electronic Apparatus)

Figure 35:
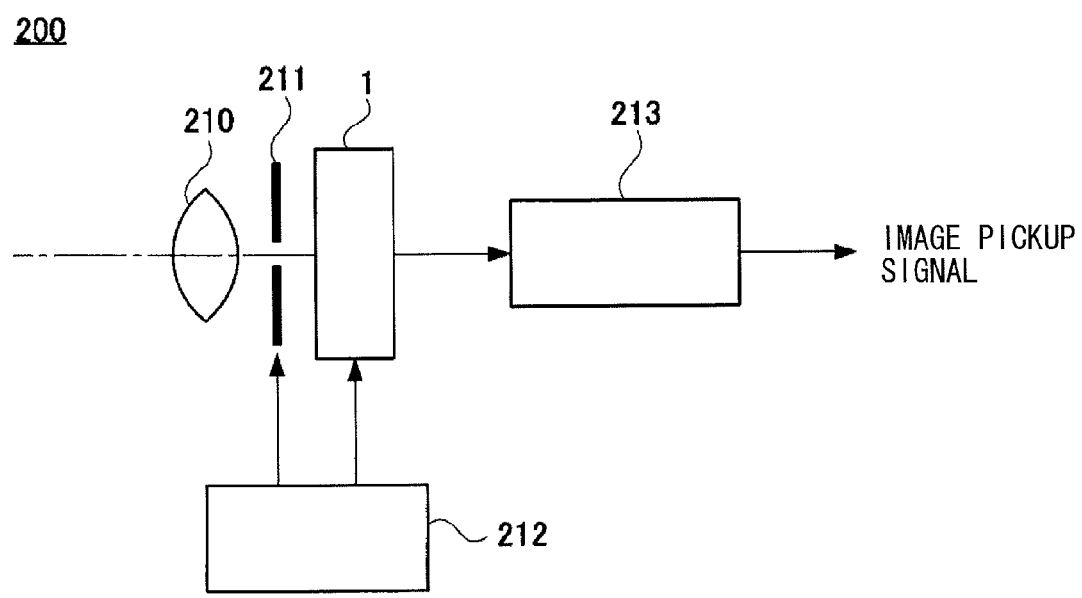
FIG. 35 is an illustrative schematic diagram (block diagram) showing an electronic apparatus according to a second embodiment, in accordance with various embodiments of the present disclosure.

Next, a description will be given of an electronic apparatus according to a second embodiment. FIG. 35 is an illustrative schematic configuration diagram (e.g., a block diagram) of the electronic apparatus according to the second embodiment.

As shown in FIG. 35, for example, an electronic apparatus 200 according to the present embodiment includes the solid-state image pickup device 1 according to the first embodiment, an optical lens 210, a shutter unit 211, a drive circuit 212, and a signal processing circuit 213.

The optical lens 210 allows image light (incident light) from a subject to be formed as an image on an image pickup plane of the solid-state image pickup device 1. Accordingly, the signal charge is accumulated in the solid-state image pickup device 1 for a certain period. The shutter unit 211 controls light application period and light shielding period of the solid-state image pickup device 1. The drive circuit 212 supplies drive signals that control operation of transferring the signal charge and shutter operation of the shutter unit 211 in the solid-state image pickup device 1. Signal transfer in the solid-state image pickup device 1 is performed based on the drive signals (timing signals) supplied from the drive circuit 212. The signal processing circuit 213 performs various kinds of signal processing. An image signal that is subjected to the signal processing is stored in a memory media such as a memory, and the stored image signal is outputted to a monitor.

In the electronic apparatus 200 of the present embodiment, the pixels are miniaturized in the solid-state image pickup device 1. Therefore, size reduction and increase in resolution is achieved in the electronic apparatus 200. Further, exposure in all of the pixels at the same time is achieved in the solid-state image pickup device 1. Therefore, high S/N ratio is obtained, which leads to improvement in image quality.

The electronic apparatus 200 to which the solid-state image pickup device 1 is applied is not limited to a digital video camcorder. The solid-state image pickup device 1 is applicable also to a digital still camera, and also to an image pickup apparatus such as camera module for mobile apparatus such as mobile phones.

In the electronic apparatus of the present embodiment described above, the solid-state image pickup device 1 according to the first embodiment is used as the solid-state image pickup device. However, the electronic apparatus of the present embodiment of the present technology is not limited to a configuration in which the solid-state image pickup device 1 according to the first embodiment is used, and may use any solid-state image pickup device as long as the image-pickup device is of any embodiment of the present technology. Moreover, the configuration of the electronic apparatus of the present technology is not limited to the configuration shown in FIG. 30, and may have a configuration other than that shown in FIG. 30 as long as the configuration uses the solid-state image pickup device according to the embodiments of the present technology.

It is possible to achieve at least the following configurations from the above-described example embodiments and the modifications of the disclosure.

Various embodiments include a solid-state imaging device comprising: a substrate; a photoelectric conversion section comprising a chalcopyrite material formed over the substrate in a light incident side; a transparent electrode in the light incident side of the photoelectric conversion section; and an electron barrier layer formed between the photoelectric conversion section and the transparent electrode.

The transparent electrode may be ITO and the chalcopyrite material may be CuInGaS. A thickness of the electron barrier layer may be about 10nm. A barrier of the electron barrier layer may be between about 0.6eV to about 1.3eV, or between about 1.0eV to about 1.3eV, and may comprise at least one of NiO, $Cu_2O$, and $ZnRh_2O_4$, or NiO. A thickness of the electron barrier layer may be between about 4nm and about 10nm, or between about 6nm and about 10nm. The solid-state imaging device may have the transparent electrode of ITO, the electron barrier layer of $Cu_2O$, a barrier of the electron barrier layer being about 1.3eV, and a thickness of the electron barrier layer being between 6nm and about 10nm. The electron barrier layer may comprise at least two materials, and the two materials may be laminated. The at least two materials may be $Cu_2O$ on $ZnRh_2O_4$.

Also, various embodiments include a manufacturing method of a solid-state imaging device comprising: forming a photoelectric conversion section comprising a chalcopyrite material; forming a transparent electrode in the light incident side of the photoelectric conversion section; and forming an electron barrier layer between the photoelectric conversion section and the transparent electrode. Again, the transparent electrode may be ITO and the chalcopyrite material may be CuInGaS. A thickness of the electron barrier layer may be about 10nm. A barrier of the electron barrier layer may be between about 0.6eV to about 1.3eV, or between about 1.0eV to about 1.3eV, and may comprise at least one of NiO, $Cu_2O$, and $ZnRh_2O_4$, or NiO. A thickness of the electron barrier layer may be between about 4nm and about 10nm, or between about 6nm and about 10nm. The solid-state imaging device may have the transparent electrode of ITO, the electron barrier layer of $Cu_2O$, a barrier of the electron barrier layer being about 1.3eV, and a thickness of the electron barrier layer being between 6nm and about 10nm. The electron barrier layer may comprise at least two materials, and the two materials may be laminated. The at least two materials may be $Cu_2O$ on $ZnRh_2O_4$.

Further embodiments include an electronic apparatus comprising: a solid-state imaging device comprising a substrate; a photoelectric conversion section comprising a chalcopyrite material formed over the substrate in a light incident side; a transparent electrode in the light incident side of the photoelectric conversion section; and an electron barrier layer formed between the photoelectric conversion section and the transparent electrode.

It is to be noted that the present technology may be configured as follows.
(1) A solid-state image pickup device including:
a substrate;
a p-type photoelectric conversion section formed on a light incident face side of the substrate, the p-type photoelectric conversion section being configured to generate signal charge in accordance with an amount of light;
a p-type transparent electrode provided on the light incident face side of the photoelectric conversion section; and
an electron barrier layer formed between the photoelectric conversion section and the transparent electrode.
(2) The solid-state image pickup device according to (1), wherein the electron barrier layer has electron barrier height, from Fermi level of the transparent electrode, of about 0.6electron volts or larger, and serves as a barrier, of about 0.5electron volts or smaller, against holes transferred from the photoelectric conversion section toward the transparent electrode.
(3) The solid-state image pickup device according to (2), wherein the electron barrier layer has the electron barrier height, from the Fermi level of the transparent electrode, of about 1.0electron volts or larger.
(4) The solid-state image pickup device according to (2) or (3), wherein the electron barrier layer has a thickness of about 4nanometers or larger.
(5) The solid-state image pickup device according to any one of (2) to (4), wherein the electron barrier layer is configured of NiO having a thickness of about 6nanometers or larger.
(6) The solid-state image pickup device according to any one of (2) to (4), wherein the electron barrier layer is configured of $Cu_2O$ having a thickness of about 9nanometers or larger.
(7) The solid-state image pickup device according to any one of (1) to (6), wherein the photoelectric conversion section is configured of a p-type chalcopyrite material having electron affinity of about 3.7electron volts or larger.
(8) The solid-state image pickup device according to any one of (1) to (7), wherein the photoelectric conversion section is configured of an epitaxial growth layer of a compound semiconductor having a chalcopyrite structure that is formed on a silicon substrate.
(9) The solid-state image pickup device according to any one of (1) to (8), wherein
the photoelectric conversion section is configured of a CuInGaS compound semiconductor having a Cu composition ratio of about 0.25, an In composition ratio of about 0.12, a Ga composition ratio of about 0.13, and an S composition ratio of about 0.5, and
variation in each of the foregoing composition ratios is within a range from about −10percent to about 10percent both inclusive.
(10) The solid-state image pickup device according to any one of (1) to (9), wherein the transparent electrode includes one or more selected from a group including ITO, AZO, $SnO_2$, and $In_2O_3$.
(11) The solid-state image pickup device according to any one of (1) to (10), wherein the substrate is an off substrate.
(12) An electronic apparatus with a solid-state image pickup device according to any one of (1) to (11) and a signal processing circuit configured to perform processing on an output signal supplied from the solid-state image pickup device.

The present technology may also be configured as follows.
[1] A solid-state imaging device comprising:
a substrate;
a photoelectric conversion section comprising a chalcopyrite material formed over the substrate in a light incident side;
a transparent electrode in the light incident side of the photoelectric conversion section; and
an electron barrier layer formed between the photoelectric conversion section and the transparent electrode.
[2] The solid-state imaging device of [1], wherein the transparent electrode is ITO and the chalcopyrite material is CuInGaS.
[3] The solid-state imaging device of [1] or [2], wherein a thickness of the electron barrier layer is about 10nm.
[4] The solid-state imaging device of any one of [1] to [3], wherein a barrier of the electron barrier layer is between 0.6eV to about 1.3eV.
[5] The solid-state imaging device of any one of [1] to [4], wherein a barrier of the electron barrier layer is between 1.0eV to about 1.3eV.
[6] The solid-state imaging device of any one of [1] to [5], wherein the electron barrier layer comprises at least one of NiO, $Cu_2O$, and $ZnRh_2O_4$.
[7] The solid-state imaging device of any one of [1] to [6], wherein the electron barrier layer is NiO.

[8] The solid-state imaging device of [7], wherein a thickness of the electron barrier layer is between about 4nm and about 10nm.

[9] The solid-state imaging device of [7] or [8], wherein a thickness of the electron barrier layer is between about 6nm and about 10nm.

[10] The solid-state imaging device of any one of [1] to [9], wherein the transparent electrode is ITO, the electron barrier layer is $Cu_2O$, a barrier of the electron barrier layer is about 1.3eV, and a thickness of the electron barrier layer is between 6nm and about 10nm.

[11] The solid-state imaging device of any one of [1] to [10], wherein the electron barrier layer comprises at least two materials, and wherein the two materials are laminated.

[12] The solid-state imaging device of [11], wherein the at least two materials are $Cu_2O$ on $ZnRh_2O_4$.

[13] A manufacturing method of a solid-state imaging device comprising: forming a photoelectric conversion section comprising a chalcopyrite material;
forming a transparent electrode in the light incident side of the photoelectric conversion section; and
forming an electron barrier layer between the photoelectric conversion section and the transparent electrode.

[14] The method of [13], wherein the transparent electrode is ITO and the chalcopyrite material is CuInGaS.

[15] The method of [13] or [14], wherein a thickness of the electron barrier layer is about 10nm.

[16] The method of any one of [13] to [15], wherein a barrier of the electron barrier layer is between 0.6eV to about 1.3eV.

[17] The method of any one of [13] to [16], wherein a barrier of the electron barrier layer is between 1.0eV to about 1.3eV.

[18] The method of any one of [13] to [17], wherein the electron barrier layer comprises at least one of NiO, $Cu_2O$, and $ZnRh_2O_4$.

[19] The method of any one of [13] to [18], wherein the electron barrier layer is NiO and a thickness of the electron barrier layer is between about 4 nm and about 10nm.

[20] An electronic apparatus comprising:
a solid-state imaging device comprising a substrate;
a photoelectric conversion section comprising a chalcopyrite material formed over the substrate in a light incident side;
a transparent electrode in the light incident side of the photoelectric conversion section; and
an electron barrier layer formed between the photoelectric conversion section and the transparent electrode.

The present application contains subject matter related to that disclosed in Japanese Priority Patent Application JP 2012-281483 filed in the Japan Patent Office on Dec. 25, 2012 the entire content of which is hereby incorporated by reference.

It should be understood by those skilled in the art that various modifications, combinations, sub-combinations, and alterations may occur depending on design requirements and other factors insofar as they are within the scope of the appended claims or the equivalents thereof.

REFERENCE SIGNS LIST 1, 15, 60 Solid-state image pickup device
2 Pixel
3 Pixel region
4 Vertical drive circuit
5 Column signal processing circuit
6 Horizontal drive circuit
7 Output circuit
8 Control circuit
9 Vertical signal line
10 Horizontal signal line
11, 12 Substrate
13 Well region
18, 52 First charge accumulation section
23 Color filter layer
24 On-chip lens
25 Second charge accumulation section
26 P-type semiconductor layer
27 First transfer gate electrode
28 Gate insulating film
29 Source-drain region
30 Second reset gate electrode
32 Second transfer gate electrode
33 First reset gate electrode
34 Floating diffusion section
35 Reset section
45 Amplifier gate electrode
46 Selection gate electrode
50, 113 Photoelectric conversion section
51, 61 Insulating layer
53 Pixel separation section
55, 56 Resist layer
57, 101, 114 Transparent electrode
58, 102 Electron barrier layer
62 First lower electrode
63 Second lower electrode
64 Via
65 Electrode plug
111 Silicon Substrate
112 N-type electrode layer
115 Reading electrode
141 Gate MOS
200 Electronic apparatus
210 Optical lens
211 Shutter unit
212 Drive circuit
213 Signal processing circuit
Tr1 First transfer transistor
Tr2 Second transfer transistor
Tr3 First reset transistor
Tr4 Second reset transistor
Tr5 Amplifier transistor
Tr6 Selection transistor

The invention claimed is:

1. A solid-state imaging device comprising:
a substrate;
a photoelectric conversion section comprising a chalcopyrite material over the substrate in a light incident side;
a transparent electrode in the light incident side of the photoelectric conversion section;
an electron barrier layer between the photoelectric conversion section and the transparent electrode, wherein the electron barrier layer comprises at least two materials which are laminated, wherein the two materials are $Cu_2O$ on $ZnRh_2O_4$.

2. The solid-state imaging device of claim 1, wherein the transparent electrode is indium-tin oxide (ITO) and the chalcopyrite material is CuInGaS.

3. The solid-state imaging device of claim 1, wherein a thickness of the electron barrier layer is between 4 nm and 10 nm.

4. The solid-state imaging device of claim 1, wherein a barrier of the electron barrier layer is between 0.6 eV to 1.3 eV.

5. The solid-state imaging device of claim 1, wherein a barrier of the electron barrier layer is between 1.0 eV to 1.3 eV.

6. A manufacturing method of a solid-state imaging device comprising:
  forming a photoelectric conversion section comprising a chalcopyrite material;
  forming a transparent electrode in the light incident side of the photoelectric conversion section;
  forming an electron barrier layer between the photoelectric conversion section and the transparent electrode, wherein the electron barrier layer comprises at least two materials which are laminated, wherein the two materials are $Cu_2O$ on $ZnRh_2O_4$.

7. The method of claim 6, wherein the transparent electrode is indium-tin oxide (ITO) and the chalcopyrite material is CuInGaS.

8. The method of claim 6, wherein a thickness of the electron barrier layer is between 4 nm and 10 nm.

9. The method of claim 6, wherein a barrier of the electron barrier layer is between 0.6 eV to 1.3 eV.

10. The method of claim 6, wherein a barrier of the electron barrier layer is between 1.0 eV to 1.3 eV.

11. An electronic apparatus comprising:
  a solid-state imaging device that comprises a substrate;
  a photoelectric conversion section that comprises a chalcopyrite material over the substrate in a light incident side;
  a transparent electrode in the light incident side of the photoelectric conversion section;
  an electron barrier layer between the photoelectric conversion section and the transparent electrode, wherein the electron barrier layer comprises at least two materials which are laminated, wherein the two materials are $Cu_2O$ on $ZnRh_2O_4$.

12. The solid-state imaging device of claim 1, further comprising an insulating layer on the light incident side of the transparent electrode.

13. The method of claim 6, further comprising forming an insulating layer on the light incident side of the transparent electrode.

14. The electronic apparatus of claim 11, further comprising an insulating layer on the light incident side of the transparent electrode.

* * * * *